(12) United States Patent
Kira et al.

(10) Patent No.: US 10,115,694 B2
(45) Date of Patent: Oct. 30, 2018

(54) ELECTRONIC DEVICE, ELECTRONIC DEVICE FABRICATION METHOD, AND ELECTRONIC APPARATUS

(71) Applicant: FUJITSU LIMITED, Kawasaki-shi, Kanagawa (JP)

(72) Inventors: Hidehiko Kira, Nagano (JP); Naoaki Nakamura, Kawasaki (JP); Sanae Iijima, Nagano (JP)

(73) Assignee: FUJITSU LIMITED, Kawasaki (JP)

( * ) Notice: Subject to any disclaimer, the term of this patent is extended or adjusted under 35 U.S.C. 154(b) by 12 days.

(21) Appl. No.: 15/368,732

(22) Filed: Dec. 5, 2016

(65) Prior Publication Data

US 2017/0186718 A1    Jun. 29, 2017

(30) Foreign Application Priority Data

Dec. 25, 2015  (JP) .................................. 2015-253364

(51) Int. Cl.
*H01L 23/12*   (2006.01)
*H01L 23/00*   (2006.01)
(Continued)

(52) U.S. Cl.
CPC .......... *H01L 24/17* (2013.01); *H01L 21/6838* (2013.01); *H01L 21/78* (2013.01);
(Continued)

(58) Field of Classification Search
CPC ....... H01L 21/6838; H01L 2224/16148; H01L 2224/16238; H01L 2224/81203;
(Continued)

(56) References Cited

U.S. PATENT DOCUMENTS

2012/0252166 A1* 10/2012 Koyanagi ............. H01L 21/561
438/109
2013/0273694 A1* 10/2013 Hsieh ................... H01L 23/427
438/113

(Continued)

FOREIGN PATENT DOCUMENTS

JP    09-082882    3/1997
JP    2004-165330  6/2004
(Continued)

*Primary Examiner* — Frederick B Hargrove
(74) *Attorney, Agent, or Firm* — Fujitsu Patent Center

(57) ABSTRACT

An electronic device includes an electronic part including a first substrate having a group of first terminals over a first front surface and having a concavity in a back surface, a filler placed in the concavity, and a flat plate placed over the back surface with the filler therebetween, and further includes a second substrate disposed on the first front surface side of the first substrate and having a group of second terminals bonded to the group of first terminals over a second front surface opposite the first front surface. The filler and flat plate minimize deformation of the first substrate and variation in the distance between the group of first terminals and the group of second terminals caused by the deformation of the first substrate, which thereby reduces the occurrence of a failure in bonding together the group of first terminals and the group of second terminals.

7 Claims, 21 Drawing Sheets

(51) Int. Cl.
H01L 25/065 (2006.01)
H01L 23/367 (2006.01)
H01L 23/31 (2006.01)
H01L 23/29 (2006.01)
H01L 25/00 (2006.01)
H01L 21/78 (2006.01)
H01L 21/683 (2006.01)

(52) U.S. Cl.
CPC ........ *H01L 23/295* (2013.01); *H01L 23/3142* (2013.01); *H01L 23/367* (2013.01); *H01L 24/32* (2013.01); *H01L 24/73* (2013.01); *H01L 24/81* (2013.01); *H01L 24/83* (2013.01); *H01L 24/92* (2013.01); *H01L 24/94* (2013.01); *H01L 25/0657* (2013.01); *H01L 25/50* (2013.01); *H01L 2224/13109* (2013.01); *H01L 2224/13111* (2013.01); *H01L 2224/13113* (2013.01); *H01L 2224/13139* (2013.01); *H01L 2224/13144* (2013.01); *H01L 2224/13147* (2013.01); *H01L 2224/13155* (2013.01); *H01L 2224/16113* (2013.01); *H01L 2224/16148* (2013.01); *H01L 2224/16238* (2013.01); *H01L 2224/2929* (2013.01); *H01L 2224/29324* (2013.01); *H01L 2224/29339* (2013.01); *H01L 2224/29344* (2013.01); *H01L 2224/29347* (2013.01); *H01L 2224/29387* (2013.01); *H01L 2224/73204* (2013.01); *H01L 2224/75981* (2013.01); *H01L 2224/81136* (2013.01); *H01L 2224/81193* (2013.01); *H01L 2224/81203* (2013.01); *H01L 2224/81815* (2013.01); *H01L 2224/831* (2013.01); *H01L 2224/9211* (2013.01); *H01L 2225/06513* (2013.01); *H01L 2225/06589* (2013.01); *H01L 2924/014* (2013.01); *H01L 2924/04642* (2013.01); *H01L 2924/05032* (2013.01); *H01L 2924/0665* (2013.01); *H01L 2924/0715* (2013.01)

(58) Field of Classification Search
CPC . H01L 2225/06513; H01L 2225/06589; H01L 23/367; H01L 25/50
See application file for complete search history.

(56) References Cited

U.S. PATENT DOCUMENTS

2013/0307146 A1* 11/2013 Osumi ............. H01L 23/49811 257/737
2014/0239478 A1* 8/2014 Hong ................. H01L 23/4334 257/698

FOREIGN PATENT DOCUMENTS

| JP | 2010-205893 | | 9/2010 | |
|---|---|---|---|---|
| JP | 2010205893 A | * | 9/2010 | ......... H01L 23/5389 |
| JP | 2012-089579 | | 5/2012 | |

* cited by examiner

ELECTRONIC DEVICE, ELECTRONIC DEVICE FABRICATION METHOD, AND ELECTRONIC APPARATUS

CROSS-REFERENCE TO RELATED APPLICATION

This application is based upon and claims the benefit of priority of the prior Japanese Patent Application No. 2015-253364, filed on Dec. 25, 2015, the entire contents of which are incorporated herein by reference.

FIELD

The embodiments discussed herein are related to an electronic device, an electronic device fabrication method, and an electronic apparatus.

BACKGROUND

The technique of stacking a plurality of semiconductor chips is known. In respect to this technique, for example, the following method is known. A lower-layer semiconductor chip is sucked and held on a suction stage and a group of bumps formed over an under surface of an upper-layer semiconductor chip sucked and held by a bonding tool are bonded to a group of bumps formed over an upper surface of the lower-layer semiconductor chip by thermocompression bonding or the like.

Japanese Laid-open Patent Publication No. 2012-089579

There may be a concavity in a surface of a semiconductor chip opposite to a surface over which a group of bumps are formed because of, for example, variation in the thickness of semiconductor substrates which occurs in a manufacturing process. When this semiconductor chip is bonded to another semiconductor chip, the surface in which the concavity is formed is sucked and held. At this time the concavity is sucked. As a result, the semiconductor chip deforms. This may lead to variation in height in the group of bumps formed over the opposite surface. If such variation in height occurs in a group of bumps of one of two semiconductor chips to be bonded together, a bonding failure may occur. For example, part of terminals or a group of terminals of the one semiconductor chip may not be bonded to corresponding terminals or a corresponding group of terminals of the other semiconductor chip.

Such a bonding failure caused by sucking and holding a surface in which a concavity is formed may occur not only in bonding groups of bumps of semiconductor chips together but also in bonding groups of terminals of various substrates, such as electronic parts and wafers, together.

SUMMARY

According to an aspect, there is provided an electronic device including a first substrate having a group of first terminals over a first surface and having a concavity in a second surface opposite to the first surface, a filler placed in the concavity, a flat plate placed over the second surface with the filler therebetween, and a second substrate disposed on a first surface side of the first substrate and having a group of second terminals bonded to the group of first terminals over a third surface opposite the first surface.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First a form of bonding terminal groups together will be described.

Figure 1A:
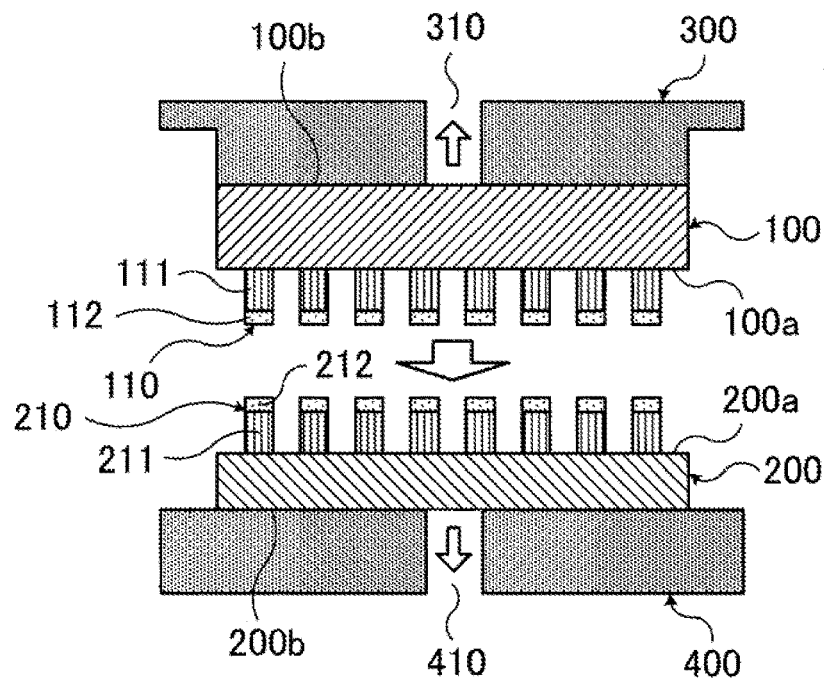
FIGS. 1A and 1B illustrate an example of bonding terminal groups together.
Figure 1B:
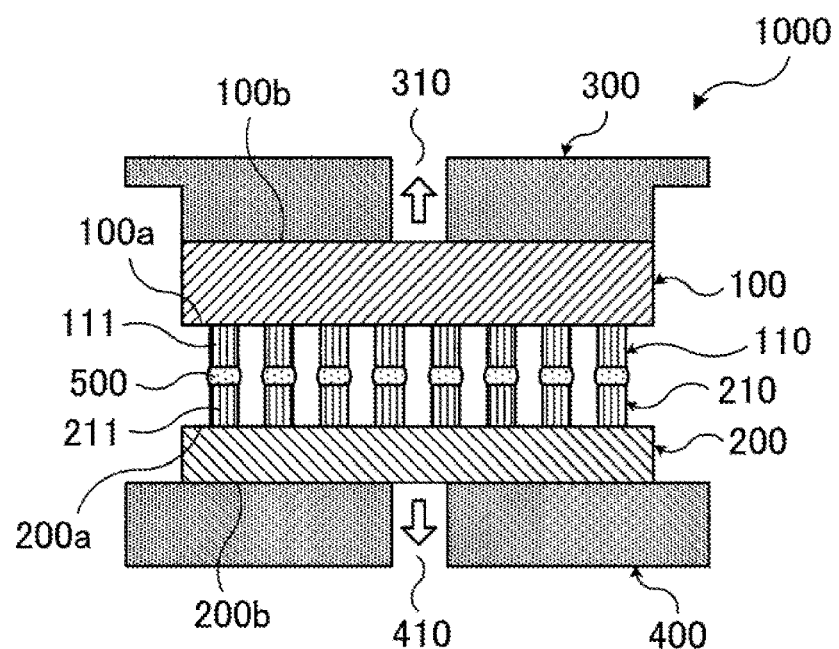

FIGS. 1A and 1B illustrate an example of bonding terminal groups together.

FIGS. 1A and 1B illustrate an example of bonding together a group of terminals 110 formed over a substrate 100 and a group of terminals 210 formed over a substrate 200. FIG. 1A illustrates an example of the state before bonding of the group of terminals 110 formed over the substrate 100 and the group of terminals 210 formed over the substrate 200. FIG. 1B illustrates an example of the state after bonding of the group of terminals 110 formed over the substrate 100 and the group of terminals 210 formed over the substrate 200.

The substrate 100 and the substrate 200 are, for example, semiconductor chips (semiconductor elements), wafers before dicing for obtaining individual semiconductor chips, or circuit boards such as interposers or printed circuit boards. The substrate 100 and the substrate 200 may be a combination of semiconductor chips, a combination of wafers, a combination of a semiconductor chip and a wafer, a combination of a semiconductor chip and a circuit board, or the like.

In this example, each terminal 110 formed over the substrate 100 includes a post (pillar) 111 formed so as to protrude from a surface (front surface) 100a of the substrate 100 and a solder 112 placed at the tip of the post 111. The post 111 is electrically connected to a conductor portion (not illustrated), such as an electrode, a wiring, or a via, or a circuit element (not illustrated), such as a transistor, formed in the substrate 100. The group of terminals 110 of the substrate 100 are formed at positions corresponding to the group of terminals 210 of the substrate 200.

The same applies to each terminal 210 formed over the substrate 200. In this example, each terminal 210 includes a post 211 formed so as to protrude from a surface (front surface) 200a of the substrate 200 and a solder 212 placed at the tip of the post 211. The post 211 is electrically connected to a conductor portion (not illustrated) or a circuit element (not illustrated) formed in the substrate 200. The group of terminals 210 of the substrate 200 are formed at positions corresponding to the group of terminals 110 of the substrate 100.

The substrate 100 having the above group of terminals 110 and the substrate 200 having the above group of terminals 210 are bonded together, for example, in the following way.

First, as illustrated in FIG. 1A, the front surface 100a of the upper substrate 100 over which the group of terminals 110 are formed and the front surface 200a of the lower substrate 200 over which the group of terminals 210 are formed are disposed opposite each other. At that time the lower substrate 200 is placed on, for example, a suction stage 400 having a hole 410 with a surface (back surface) 200b opposite to the front surface 200a over which the group of terminals 210 are formed toward the suction stage 400, is sucked through the hole 410, and is held. With the upper substrate 100, for example, a bonding tool 300 having a hole 310 is used. A surface (back surface) 100b of the upper substrate 100 opposite to the front surface 100a over which the group of terminals 110 are formed is sucked through the hole 310 and is held. The substrate 100 sucked and held by the bonding tool 300 is disposed over the substrate 200 sucked and held on the suction stage 400. Alignment between the group of terminals 110 and the group of terminals 210 is performed to dispose the group of terminals 110 opposite the group of terminals 210.

In this state, at the same time that the substrate 100 sucked and held by the bonding tool 300 is being heated by, for example, a heating mechanism included in the bonding tool 300, the substrate 100 is pressed to the substrate 200 side sucked and held on the suction stage 400. By doing so, the solders 112 of the terminals 110 of the substrate 100 and the corresponding solders 212 of the terminals 210 of the substrate 200 are melted and integrated. As a result, as illustrated in FIG. 1B, the posts 111 and the posts 211 are bonded together by solder bonding portions 500.

By performing this bonding, an electronic device 1000 in which the substrate 100 and the substrate 200 are connected electrically and mechanically by the posts 111, the solder bonding portions 500, and the posts 211 is obtained.

However, the back surface 100b of the substrate 100 sucked and held by, for example, the bonding tool 300 may have irregularities because of variation in the thickness of substrates which occurs in the process of manufacturing the substrate 100. The presence of the irregularities may make it impossible to successfully bond the group of terminals 110 of the substrate 100 to the group of terminals 210 of the substrate 200. This problem will be described by reference to FIGS. 2A through 2C.

Figure 2A:
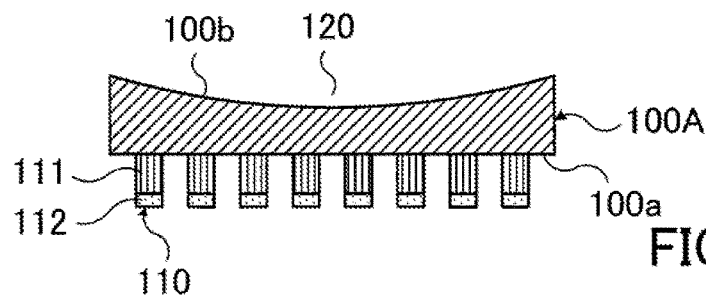
FIGS. 2A through 2C illustrate another example of bonding terminal groups together.
Figure 2B:
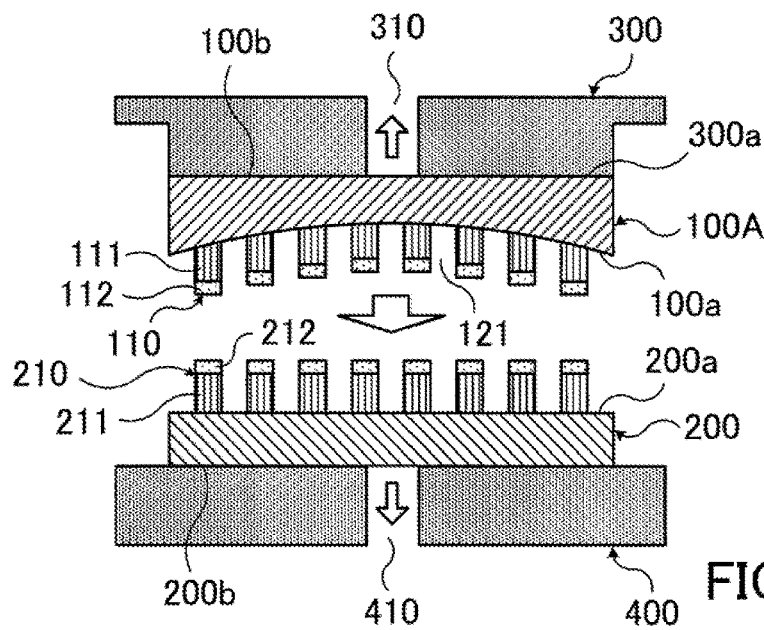
Figure 2C:
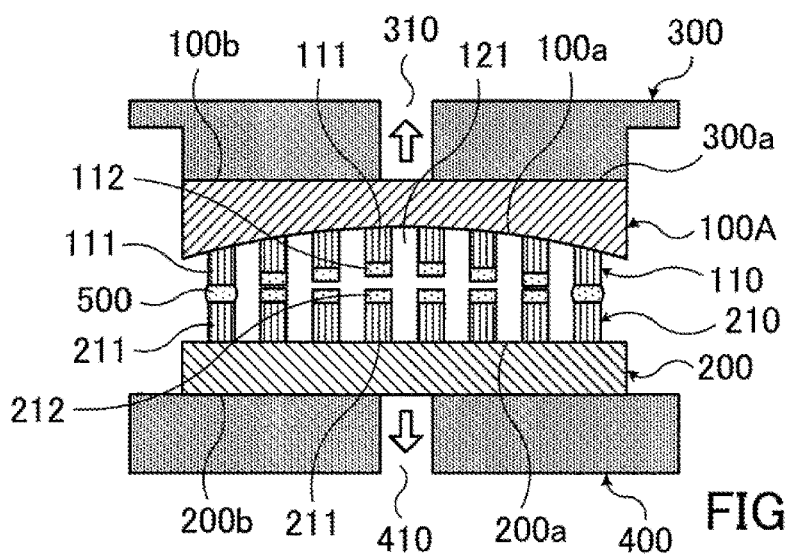

FIGS. 2A through 2C illustrate another example of bonding terminal groups together.

FIGS. 2A through 2C are views for describing bonding together a group of terminals 110 of a substrate 100A having a concavity 120 in a back surface 100b and a group of terminals 210 of a substrate 200. FIG. 2A illustrates an example of the substrate 100A having the concavity 120 in the back surface 100b. FIG. 2B illustrates an example of the state before bonding of the group of terminals 110 of the substrate 100A and the group of terminals 210 of the substrate 200. FIG. 2C illustrates an example of the state after bonding of the group of terminals 110 of the substrate 100A and the group of terminals 210 of the substrate 200. With the exception that the substrate 100A has the concavity 120 in the back surface 100b, the substrate 100A is equal in structure to the above substrate 100.

The concavity 120 illustrated in FIG. 2A may be formed in the process of manufacturing the substrate 100A. For example, if a semiconductor substrate of a semiconductor chip on which circuit elements, such as transistors, are formed or a semiconductor substrate (wafer) before dicing for obtaining individual semiconductor chips is polished by chemical mechanical polishing (CMP) or is back-ground to reduce the thickness, then the above concavity 120 may be formed. The depth of the concavity 120, that is to say, variation in the thickness (difference in thickness between the deepest portion and the shallowest portion) in the substrate 100A depends on the size of the substrate 100A and is greater than, for example, 10 µm.

When the group of terminals 110 formed over a front surface 100a of the substrate 100A having the above concavity 120 in the back surface 100b are bonded to the group of terminals 210 formed over a front surface 200a of the substrate 200, the back surface 100b of the substrate 100A is sucked and held by a bonding tool 300. However, if the back surface 100b of the substrate 100A in which the concavity 120 is formed is sucked in this way by the bonding tool 300, the following may occur. That is to say, when gas between the back surface 100b and a front surface (sucking surface) 300a of the bonding tool 300 is evacuated through a hole 310, the inside of the concavity 120 is sucked on the sucking surface 300a as illustrated in FIG. 2B. As a result, the substrate 100A changes in shape and has a concavity 121 in the front surface 100a (over which the group of terminals 110 are formed).

As a result of sucking and holding the back surface 100b having the concavity 120, the concavity 121 is formed in the front surface 100a of the substrate 100A opposite to the back surface 100b. Accordingly, even if the group of terminals 110 in which height variation is controlled are formed in advance over the front surface 100a, comparatively large height variation occurs in the group of terminals 110. As a result, as illustrated in FIG. 2C, when the group of terminals 110 of the substrate 100A are bonded to the group of terminals 210 of the substrate 200 sucked and held on a suction stage 400, part of the terminals 110 (part of the group of terminals 110) may not be bonded to part of the terminals 210 (part of the group of terminals 210) because of variation in the distance between the group of terminals 110 and the group of terminals 210.

Such a bonding failure depends on the shape of the substrate 100A. Accordingly, as long as the back surface 100b is sucked on the sucking surface 300a (flat surface) of the bonding tool 300, an increase in load does not eliminate the variation in the distance between the group of terminals 110 and the group of terminals 210. As a result, (posts 111 of) the terminals 110 (group of terminals 110) and (posts 211 of) the terminals 210 (group of terminals 210) bonded together at the beginning are apart and all the group of terminals 110 and all the group of terminals 210 may not be bonded together.

If there is comparatively large height variation from the beginning before bonding in the group of terminals 110 of the substrate 100A or the group of terminals 210 of the substrate 200, then the above bonding failure may be more apt to occur.

Figure 3A:
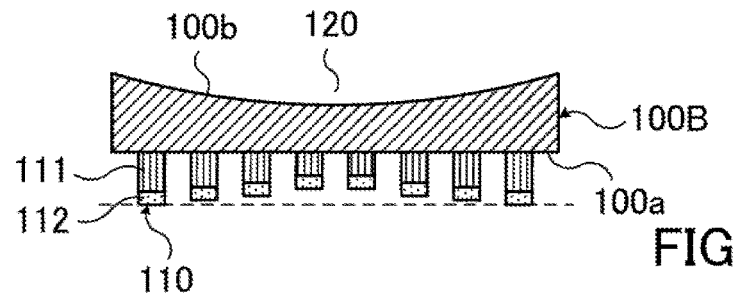
FIGS. 3A through 3C illustrate an example of bonding in the case of there being height variation in a terminal group.
Figure 3B:
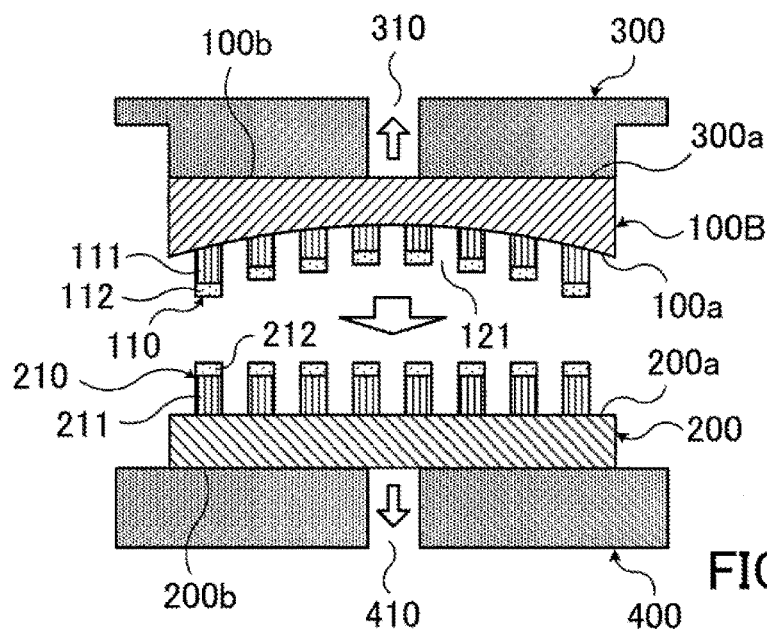
Figure 3C:
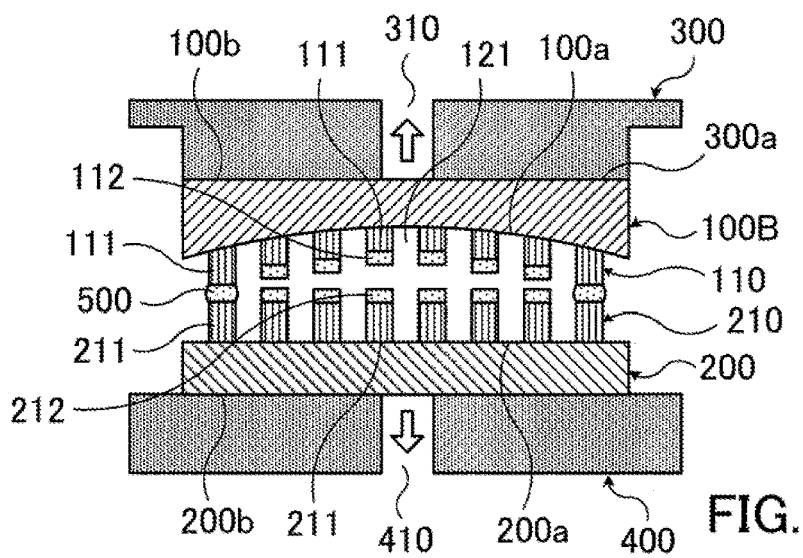

FIGS. 3A through 3C illustrate an example of bonding in the case of there being height variation in a terminal group.

FIG. 3A illustrates an example of a substrate 100B having a concavity 120 in a back surface 100b and having over a front surface 100a a group of terminals 110 in which there is height variation. FIG. 3B illustrates an example of the state before bonding of the group of terminals 110 of the substrate 100B and a group of terminals 210 of a substrate 200. FIG. 3C illustrates an example of the state after bonding of the group of terminals 110 of the substrate 100B and the group of terminals 210 of the substrate 200. With the exception that the substrate 100B has the concavity 120 in the back surface 100b and has over the front surface 100a the group of terminals 110 in which there is height variation, the substrate 100B is equal in structure to the above substrate 100.

As illustrated in FIG. 3A, in the group of terminals 110 formed over the front surface 100a opposite to the back surface 100b in which the concavity 120 is formed, there may be variation in the height from the front surface 100a to a vertex portion of each terminal 110 (tip of each solder 112). For example, there may be a height variation of about 3 μm in the group of terminals 110. The substrate 100B of FIG. 3A in which the height from the front surface 100a of a terminal 110 corresponding to a comparatively deep portion of the concavity 120 is lower than the height from the front surface 100a of a terminal 110 corresponding to a comparatively shallow portion of the concavity 120 is taken as an example.

As illustrated in FIG. 3B, when the back surface 100b of the substrate 100B is sucked and held by a bonding tool 300, the concavity 120 in the back surface 100b is sucked and the substrate 100B changes in shape. That is to say, a concavity 121 is formed in the front surface 100a opposite to the back surface 100b. This is the same with the above substrate 100A. As a result, as illustrated in FIG. 3C, when the group of terminals 110 of the substrate 100B are bonded to the group of terminals 210 of the substrate 200 sucked and held on a suction stage 400, the distance between a terminal 110 corresponding to a comparatively deep portion of the concavity 120 whose height from the front surface 100a is comparatively low and a corresponding terminal 210 increases. Therefore, with the substrate 100B of FIGS. 3A through 3C having the concavity 120 and the group of terminals 110 in which there is height variation, a bonding failure is more apt to occur. For example, part of the terminals 110 (part of the group of terminals 110) may not be bonded to part of the terminals 210 (part of the group of terminals 210).

As has been described in the foregoing, with the substrate 100A or the substrate 100B having the concavity 120 in the back surface 100b sucked by the bonding tool 300, a bonding failure may occur at the time of bonding the group of terminals 110 to the corresponding group of terminals 210 of the substrate 200.

A case where the concavity 120 is in the back surface 100b of the substrate 100A or the substrate 100B sucked and held by the bonding tool 300 is taken as an example. Furthermore, if a concavity is in the back surface 200b of the substrate 200 sucked and held on the suction stage 400 or if both of the substrate 100A or the substrate 100B and the substrate 200 have concavities, the same bonding failure may occur.

In view of the above problems, techniques described in the following as embodiments are used for preventing a bonding failure which may occur at the time of bonding groups of terminals of substrates together.

A first embodiment will be described first.

Figure 4:
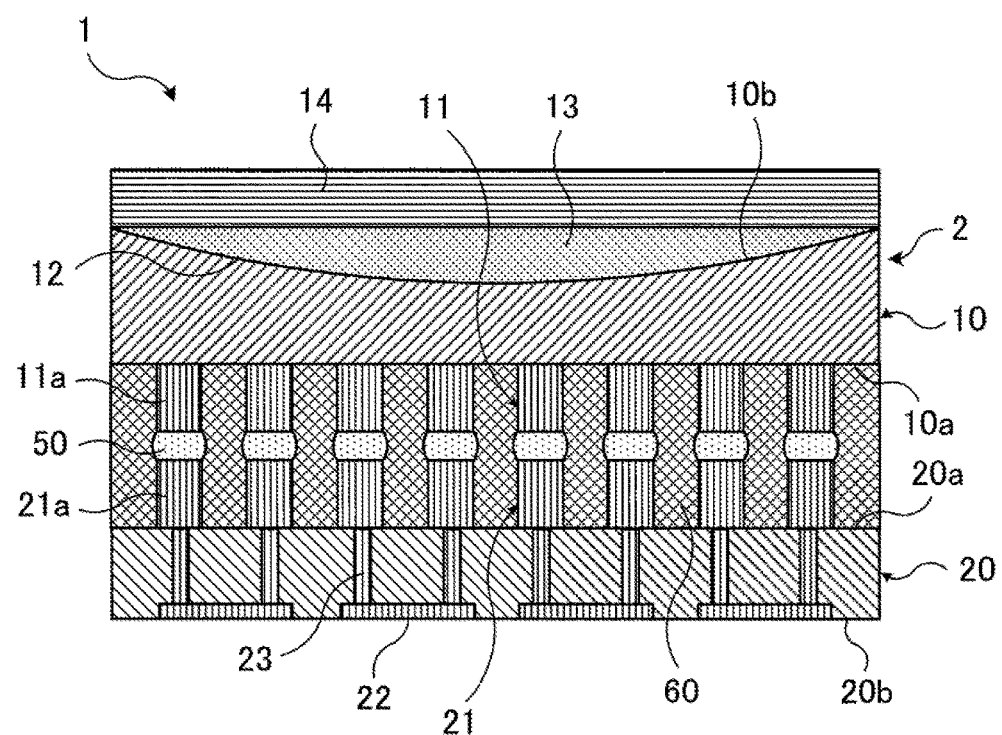
FIG. 4 illustrates an example of an electronic device according to a first embodiment.

FIG. 4 illustrates an example of an electronic device according to a first embodiment.

FIG. 4 is a fragmentary schematic sectional view of an electronic device 1. The electronic device 1 includes a substrate 10 and a substrate 20. The substrate and the substrate 20 are, for example, semiconductor chips, wafers before dicing for obtaining individual semiconductor chips, or circuit boards such as interposers or printed circuit boards. The substrate 10 and the substrate 20 may be a combination of semiconductor chips, a combination of wafers, a combination of a semiconductor chip and a wafer, a combination of a semiconductor chip and a circuit board, or the like.

The substrate 10 has a group of terminals 11 over one surface (front surface) 10a and has a concavity 12 in a surface (back surface) 10b opposite to the front surface 10a. In this example, a terminal 11 including a post 11a formed so as to protrude from the front surface 10a of the substrate 10 is illustrated. The post 11a is formed by the use of a material such as copper (Cu), nickel (Ni), or gold (Au). The post 11a is electrically connected to a conductor portion (not illustrated), such as an electrode, a wiring, or a via, or a circuit element (not illustrated), such as a transistor, formed in the substrate 10. Furthermore, in this example, a central portion of the concavity 12 is deeper than an end portion of the concavity 12 in section. For example, the concavity 12 is formed in the process of manufacturing the substrate 10. If a semiconductor substrate of a semiconductor chip on which circuit elements, such as transistors, are formed or a semiconductor substrate (wafer) before dicing for obtaining individual semiconductor chips is polished by the CMP or is back-ground to reduce the thickness, then the above concavity 12 may be formed.

A filler 13 is placed in the concavity 12 in the back surface 10b of the substrate 10. A material having a certain heat conduction property is used as the filler 13. For example, a material whose heat conduction property is higher than or equal to that of the substrate 10 is used as the filler 13. A resin composition containing resin containing particles of a material having a certain heat conduction property as a filler may be used as the filler 13. A material, such as silver (Ag), Cu, Au, aluminum (Al), silicon carbide (SiC), or aluminum nitride (AlN), is used as a filler. A material, such as epoxy resin or silicone resin, is used as resin.

A flat plate 14 is placed over the back surface 10b of the substrate 10 with the filler 13 placed in the concavity 12 therebetween. A material having a certain heat conduction property is used as the flat plate 14. For example, a material whose heat conduction property is higher than or equal to that of the substrate 10 is used as the flat plate 14. A material having not only a certain heat conduction property but also certain rigidity is used as the flat plate 14. For example, a material whose rigidity is higher than or equal to that of the substrate 10 is used as the flat plate 14. A material, such as Cu, Al, SiC, or AlN, or silicon (Si), having a certain heat conduction property and certain rigidity is used as the flat plate 14.

A structure including the substrate 10, the group of terminals 11, the concavity 12, the filler 13, and the flat plate 14 corresponds to an upper electronic part 2 in the electronic device 1.

The substrate 20 bonded to the electronic part 2 including the substrate 10 has a group of terminals 21 over a surface (front surface) 20a opposite the front surface 10a of the substrate 10 (over which the group of terminals 11 are formed). The group of terminals 21 of the substrate 20 are formed at positions corresponding to the group of terminals 11 of the substrate 10. In this example, a terminal 21 including a post 21a formed so as to protrude from the front surface 20a of the substrate 20 is illustrated. The post 21a is formed by the use of a material such as Cu, Ni, or Au. The post 21a is electrically connected to a conductor portion (not illustrated), such as an electrode, a wiring, or a via, or a circuit element (not illustrated), such as a transistor, formed in the substrate 20.

As illustrated in FIG. 4, the substrate 20 may have a group of terminals 22 in a surface (back surface) 20b opposite to the front surface 20a over which the group of terminals 21 are formed. In this example, pads are illustrated as the group of terminals 22 formed in the back surface 20b. A terminal 21 formed over the front surface 20a and a terminal 22 formed in the back surface 20b are electrically connected via a conductor 23 formed by the use of a through silicon via (TSV) formation technique, a through hole formation technique, or the like according to, for example, the form of the substrate 20.

A terminal 11 (post 11a) of the substrate 10 (electronic part 2) and a terminal 21 (post 21a) of the substrate 20 are bonded together by a solder bonding portion 50. A solder containing tin (Sn) is used for forming the solder bonding portion 50. For example, a Sn solder, a Sn—Ag solder containing Sn and Ag, a Sn—Ag—Cu solder containing Sn, Ag, and Cu, a Sn—In solder containing Sn and indium (In), or a Sn—Bi solder containing Sn and bismuth (Bi) is used as a solder contained in the solder bonding portion 50. The substrate 10 and the substrate 20 are connected electrically and mechanically by posts 11a, solder bonding portions 50, and posts 21a.

As illustrated in FIG. 4, a resin layer 60 which covers the posts 11a, the solder bonding portions 50, and the posts 21a may be formed between the substrate 10 and the substrate 20 bonded together. Various insulating resin materials, such as epoxy resin, may be used for forming the resin layer 60. The resin layer 60 may contain an insulating filler. Bonding strength between the substrate and the substrate 20 bonded together via the solder bonding portions 50 is improved by the resin layer 60.

An example of a method for forming the electronic device 1 having the above structure will now be described with reference to FIGS. 5A through 5C and FIGS. 6A and 6B.

Figure 5A:
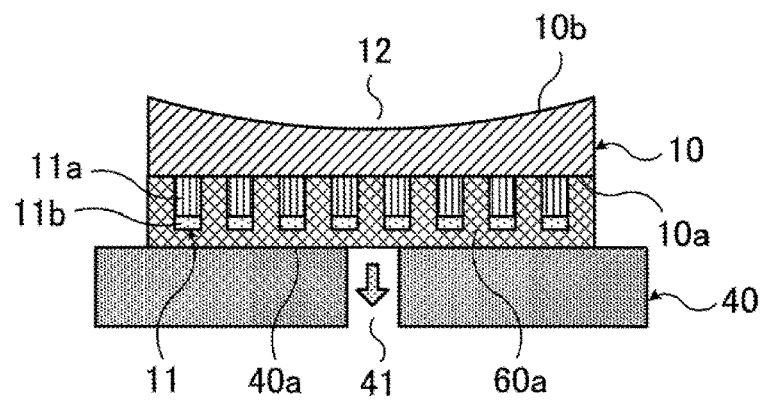
FIGS. 5A through 5C illustrate an example of a method for forming an electronic part according to the first embodiment.
Figure 5B:
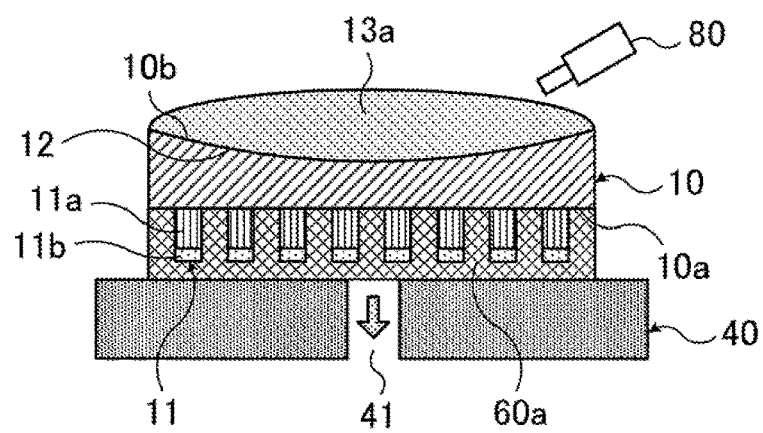
Figure 5C:
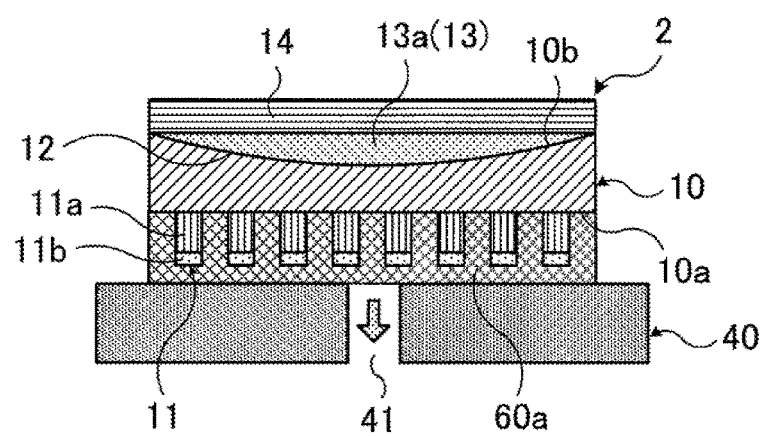

FIGS. 5A through 5C illustrate an example of a method for forming the electronic part according to the first embodiment.

FIG. 5A is a fragmentary schematic sectional view of a process for sucking a substrate 10. FIG. 5B is a fragmentary schematic sectional view of a process for placing a filler 13. FIG. 5C is a fragmentary schematic sectional view of a process for placing a flat plate 14. The formation of the electronic part 2 will now be described in order with reference to FIGS. 5A through 5C.

First the substrate 10 illustrated in FIG. 5A is prepared. The substrate 10 has a group of terminals 11 over a front surface 10a and has a concavity 12 in a back surface 10b. A terminal 11 includes a post 11a and a solder 11b placed at the tip of the post 11a. A Sn solder, a Sn—Ag solder, a Sn—Ag—Cu solder, a Sn—In solder, a Sn—Bi solder or the like is used as the solder 11b. As stated above, the concavity 12 is formed by, for example, the CMP or back grind performed in the process of manufacturing the substrate 10.

As illustrated in FIG. 5A, for example, a resin layer 60a is formed over the front surface 10a of the substrate 10 over which the group of terminals 11 are formed. The resin layer 60a becomes the above resin layer 60 illustrated in FIG. 4. A paste resin material, such as a non-conductive paste (NCP), or a film-shaped resin material, such as a non-conductive film (NCF), is used for forming the resin layer 60a over the front surface 10a of the substrate 10. The thickness of the resin layer 60a formed in advance over the front surface 10a of the substrate 10 before bonding the substrate 10 to a substrate 20 is set on the basis of a gap between the substrate 10 and the substrate 20 after bonding so as to cover a post 11a and a solder 11b of each terminal 11.

As illustrated in FIG. 5A, the substrate 10 over whose front surface 10a the resin layer 60a is formed is placed on a sucking surface 40a of a suction stage 40 having a hole 41 with the front surface 10a over which the resin layer 60a is formed toward the suction stage 40, is sucked through the hole 41, and is held. When the front surface 10a side of the substrate 10 (resin layer 60a formed over the front surface 10a, in this example) is sucked on the suction stage 40, a state in which height variation in the group of terminals 11 is minimized is maintained or arises. The concavity 12 remains in the back surface 10b of the substrate 10.

As illustrated in FIG. 5B, in a state in which the substrate 10 over whose front surface 10a the resin layer 60a is formed is sucked and held in this way on the suction stage 40, a filler 13a is placed in the concavity 12 in the back surface 10b of the substrate 10. The filler 13a becomes the above filler 13 illustrated in FIG. 4. For example, a supply apparatus 80, such as a dispenser, is used for applying the liquid filler 13a to the back surface 10b of the substrate 10 in which the concavity 12 is formed. A film-shaped filler 13a may be placed on the back surface 10b of the substrate 10 in which the concavity 12 is formed. In this case, the concavity 12 does not need to be filled in with the film-shaped filler 13a at the stage at which the film-shaped filler 13a is placed on the back surface 10b of the substrate 10.

Figure 20:
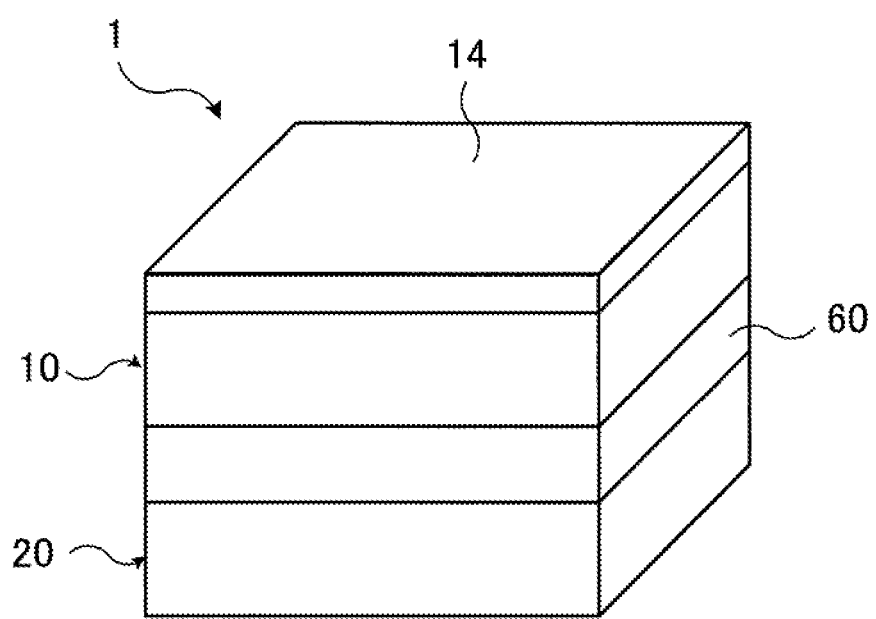
FIG. 20 illustrates an example of an electronic device.

As illustrated in FIG. 5C, after the filler 13a is placed on the back surface 10b of the substrate 10 in which the concavity 12 is formed, the flat plate 14 is placed over the back surface 10b of the substrate 10. As illustrated in FIG. 20, for example, the flat plate 14 is equal in size to the back surface 10b of the substrate 10 in planar view. The flat plate 14 is placed over the substrate 10 which is sucked and held on the suction stage 40 and in whose back surface 10b the filler 13a is placed in the concavity 12. If thermosetting resin, for example, is used as the filler 13a, then heating and pressurization are performed. By doing so, the filler 13a in the concavity 12 in the back surface 10b is cured (above filler 13 illustrated in FIG. 4 is formed) and the flat plate 14 is fixed onto the back surface 10b.

If the film-shaped filler 13a is used, the concavity 12 is filled in with the filler 13a which softens or melts, the filler 13a is cured (above filler 13 illustrated in FIG. 4 is formed), and the flat plate 14 is fixed onto the back surface 10b, at the time of heating and pressurization.

The filler 13a may be cured by directing light such as ultraviolet rays, depending on the form of resin (component, such as a hardener, contained) used as the filler 13a. In the processes of FIGS. 5A and 5B, for example, photo-curing resin used as the filler 13a is placed in the concavity 12 in the back surface 10b of the substrate 10 sucked and held on the suction stage 40. In the process of FIG. 5C, the flat plate 14 is pressed to the substrate 10 side and light is directed. By doing so, the filler 13a in the concavity 12 is cured (above filler 13 illustrated in FIG. 4 is formed) and the flat plate 14 is fixed onto the back surface 10b.

Figure 6A:
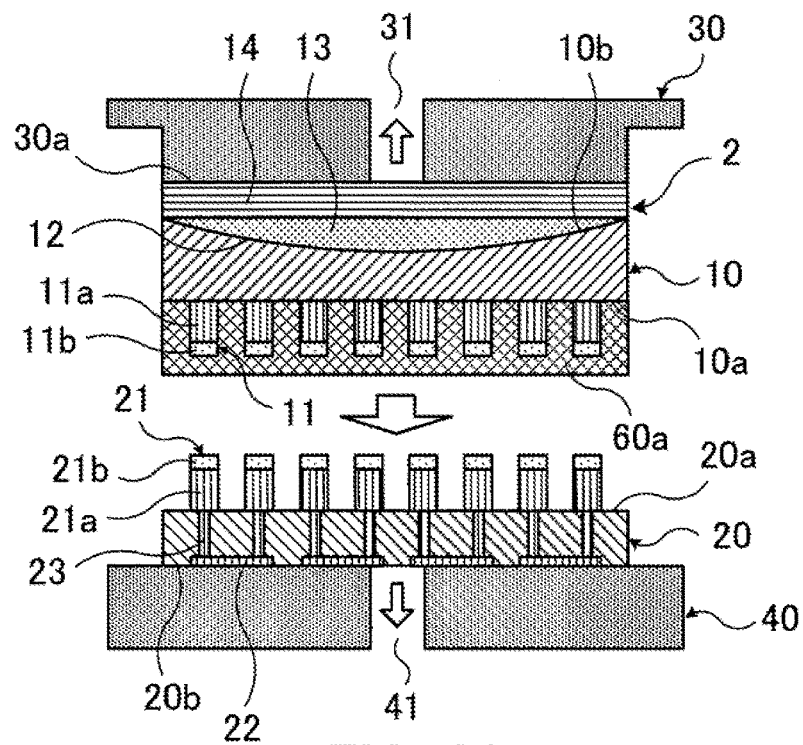
FIGS. 6A and 6B illustrate an example of a terminal group bonding method according to the first embodiment.
Figure 6B:
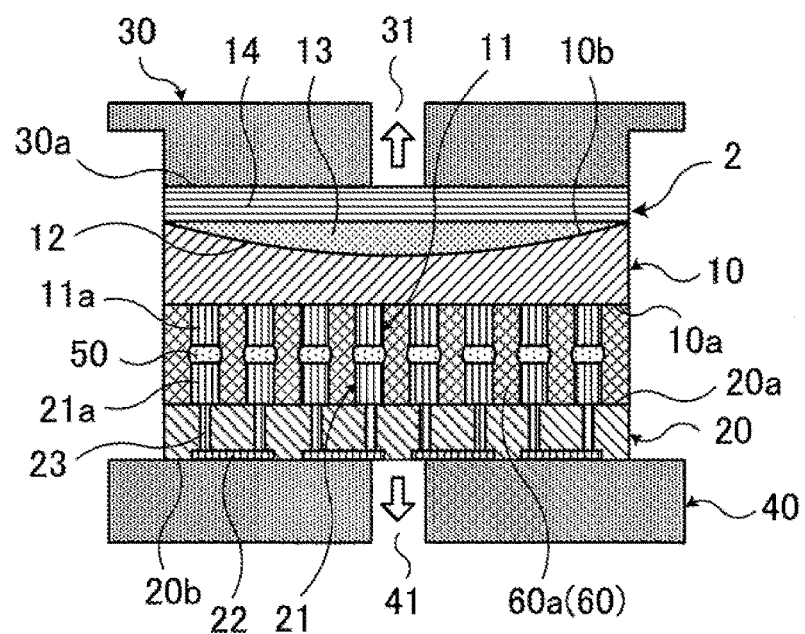

By the processes illustrated in FIGS. 5A through 5C, the flat plate 14 is placed over the back surface 10b of the substrate 10 with the filler 13a with which the concavity 12 is filled in therebetween, and the electronic part 2 is formed. The formed electronic part 2 is removed from the suction stage 40. As illustrated in FIGS. 6A and 6B, the group of terminals 11 of the electronic part 2 are bonded to a group of terminals 21 of the substrate 20.

FIGS. 6A and 6B illustrate an example of a terminal group bonding method according to the first embodiment.

FIG. 6A illustrates an example of the state before bonding of the group of terminals 11 of the electronic part 2 (substrate 10) and the group of terminals 21 of the substrate 20. FIG. 6B illustrates an example of the state after bonding of the group of terminals 11 of the electronic part 2 (substrate 10) and the group of terminals 21 of the substrate 20.

The substrate 20 illustrated in FIG. 6A is prepared. The substrate 20 has the group of terminals 21 over a front surface 20a and has a group of terminals (pads) 22 in a back surface 20b. A terminal 21 formed over the front surface 20a includes a post 21a and a solder 21b placed at the tip of the post 21a. A Sn solder, a Sn—Ag solder, a Sn—Ag—Cu solder, a Sn—In solder, a Sn—Bi solder or the like is used as the solder 21b. The substrate 20 is placed on a suction stage 40 having a hole 41 with the back surface 20b in which the group of terminals 22 are formed toward the suction stage 40, is sucked through the hole 41, and is held.

As illustrated in FIG. 6A, with the electronic part 2 a bonding tool 30 having a hole 31 is used. The flat plate 14 placed over the back surface 10b of the substrate 10 with the filler 13a therebetween is sucked through the hole 31 and held by the bonding tool 30. The electronic part 2 sucked and held by the bonding tool 30 is disposed over the substrate 20 on the suction stage 40. Alignment between the group of terminals 11 and the group of terminals 21 is performed to dispose the group of terminals 11 opposite the group of terminals 21.

In the process illustrated in FIG. 6A, in the electronic part 2 sucked and held by the bonding tool 30, the concavity 12 in the back surface 10b is filled in with the filler 13 and the flat plate 14 is placed on the sucking surface 30a side of the bonding tool 30. By doing so, flattening is performed. Accordingly, a situation such as deformation of the electronic part 2 at the time of being sucked by the bonding tool 30, that is to say, a situation, such as deformation of the substrate 100 which is illustrated in FIG. 2B or FIG. 3B and which occurs for the reason that the concavity 120 is sucked, is effectively reduced.

The flat plate 14 has certain rigidity and functions as a stiffener. That is to say, when the electronic part 2 is sucked by the bonding tool 30, the flat plate 14 minimizes deformation of the electronic part 2 or keeps the shape of the electronic part 2. Deformation of the electronic part 2 is minimized in this way at the time of being sucked by the bonding tool 30. As a result, height variation in the group of terminals 11 formed over the front surface 10a is minimized. A material for and the thickness of the flat plate 14 are set so as to minimize deformation of the electronic part 2 which occurs at the time of being sucked by the bonding tool 30.

As illustrated in FIG. 6A, the electronic part 2 is sucked and held by the bonding tool 30. Next, as illustrated in FIG. 6B, at the same time that the electronic part 2 is being heated by, for example, a heating mechanism included in the bonding tool 30, the electronic part 2 is pressed to the substrate 20 side sucked and held on the suction stage 40. At this time the group of terminals 11 on the electronic part 2 side crash through the resin layer 60a due to pressing. As a result, a solder 11b of each terminal 11 touches a solder 21b of a corresponding terminal 21 on the substrate 20 side. The solder 11b and the solder 21b are melted and integrated by heating. By doing so, a solder bonding portion 50 is formed. Furthermore, the resin layer 60a is cured (above resin layer 60 illustrated in FIG. 4 is formed) by heating at the time of the formation of the solder bonding portions 50 or by a curing process (heating, light irradiation, or the like) after the formation of the solder bonding portions 50.

As a result, the electronic part 2 and the substrate 20 are connected electrically and mechanically by the posts 11a, the solder bonding portions 50, and the posts 21a. In addition, the resin layer 60 is formed between the electronic part 2 and the substrate 20. Accordingly, bonding strength between the electronic part 2 and the substrate 20 is improved.

The solders 21b do not need to be placed on the posts 21a of the terminals 21 of the substrate 20. By bonding the solders 11b placed on the posts 11a of the terminals 11 of the substrate 10 to the posts 21a of the substrate 20, the solder bonding portions 50 may be formed.

In the process illustrated in FIG. 6B, deformation of the electronic part 2 is minimized by the filler 13 and the flat plate 14 at the time of being sucked by the bonding tool 30. As a result, height variation in the group of terminals 11 is minimized. Accordingly, variation in the distance between the group of terminals 11 on the electronic part 2 side and the group of terminals 21 on the substrate 20 side is minimized. A bonding failure is effectively reduced. For example, a bonding failure in which part of the terminals 11 (part of the group of terminals 11) are not bonded to part of the terminals 21 (part of the group of terminals 21), that is to say, a bonding failure illustrated in FIG. 2C or FIG. 3C is effectively reduced.

The electronic part 2 and the substrate 20 bonded together are removed from the bonding tool 30 and the suction stage 40 respectively. As a result, the electronic device 1 illustrated in FIG. 4 is obtained.

As stated above, in the electronic device 1 a bonding failure which occurs between the group of terminals 11 and the group of terminals 21 is effectively reduced by the filler 13 with which the concavity 12 in the back surface 10b of the substrate 10 is filled in and the flat plate 14 placed over the back surface 10b with the filler 13 therebetween.

In addition, by using a material having a good heat conduction property for the filler 13 and the flat plate 14 in the electronic device 1, the heat transfer characteristic is improved. For example, a semiconductor chip or the like which generates heat at operation time may be used as the substrate 10 included in the electronic part 2 or the substrate 20 bonded to the substrate 10. In this case, if the filler 13 and the flat plate 14 each having a good heat conduction property are used in the electronic device 1, heat generated by the substrate 10 or transferred to the substrate 10 is efficiently transferred to the flat plate 14 through the filler 13 and is efficiently radiated from the flat plate 14 to the outside of the electronic device 1. That is to say, the filler 13 functions as a thermal interface material (TIM) between the substrate 10 and the flat plate 14 and the flat plate 14 functions as a heat spreader or a radiation plate. This reduces the occurrence of overheat of the substrate 10 and the substrate 20 at operation time. Accordingly, deterioration in the performance of or damage to the substrate 10 and the substrate 20 caused by overheat is effectively minimized and a high performance and high-quality electronic device 1 is realized.

Furthermore, there are cases where a semiconductor chip which emits electromagnetic waves at operation time, a semiconductor chip whose operation may be influenced by electromagnetic waves from the outside, or the like is used as the substrate 10 included in the electronic part 2 of the electronic device 1. In these cases, the flat plate 14 in the electronic device 1 may also function as an electromagnetic wave shielding member for reducing electromagnetic wave emission from the substrate 10 or electromagnetic wave incidence to the substrate 10, depending on a material used as the flat plate 14 or the frequency of electromagnetic waves.

The electronic device 1 may be electrically connected to another electronic part or electronic device by the use of a terminal 22 of the substrate 20. For example, the electronic device 1 is electrically connected to a semiconductor chip, a semiconductor chip laminate, a circuit board, a semiconductor chip (group) mounted over a circuit board, or the like by the use of a terminal 22.

Furthermore, in the above description a single concavity 12 having a shape in which a central portion is deeper than an end portion is cited as the concavity 12 in the back surface 10b of the substrate 10. However, the shape of the concavity 12 in the back surface 10b of the substrate 10 is not limited to the above shape.

Figure 7A:
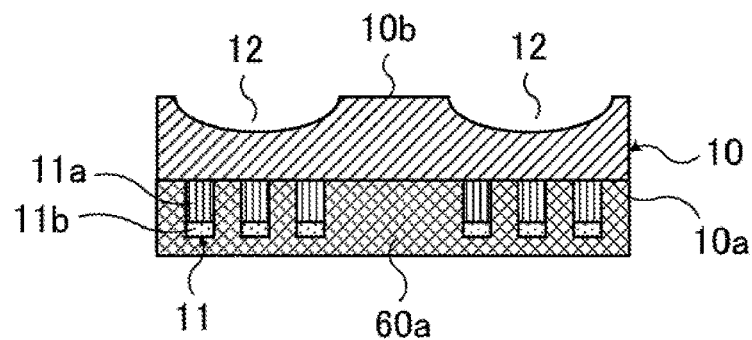
FIGS. 7A through 7C illustrate a first modification.
Figure 7B:
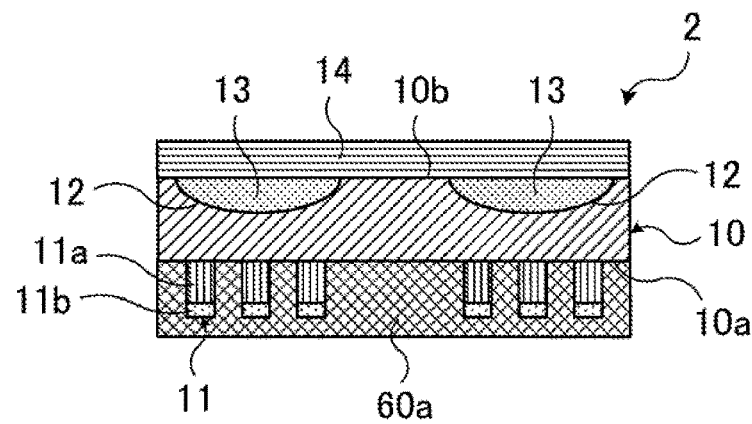
Figure 7C:
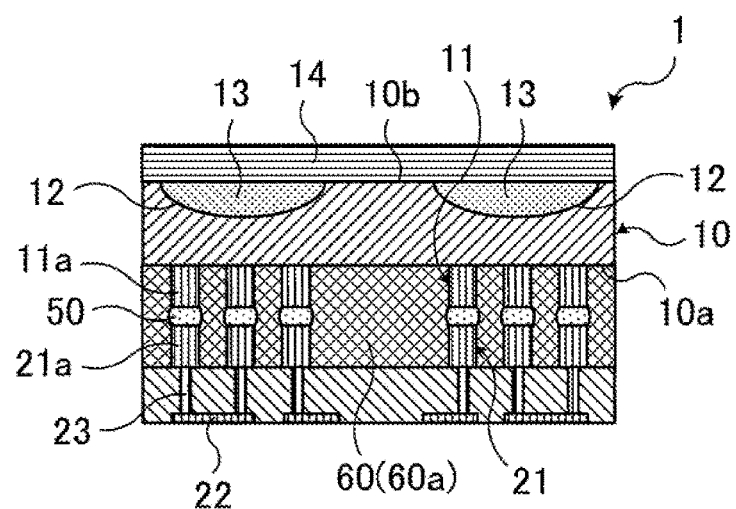

FIGS. 7A through 7C illustrate a first modification.

FIG. 7A is a fragmentary schematic sectional view of another example of the substrate 10. FIG. 7B is a fragmentary schematic sectional view of another example of the electronic part 2. FIG. 7C is a fragmentary schematic sectional view of another example of the electronic device 1.

A substrate 10 illustrated in FIG. 7A has concavities 12 in plural portions (two portions in section, for example) of a back surface 10b. As stated above, the CMP or the back grind may be performed on the back surface 10b in the process of manufacturing the substrate 10. At this time the positions or number of concavities 12 formed may change according to the disposition (density) of a group of terminals 11 formed over a front surface 10a or the disposition (density) of conductor portions in the substrate 10 to which the group of terminals 11 are connected. As illustrated in FIG. 7A, for example, a comparatively large load is apt to be applied at the time of the CMP or the back grind to areas of the back surface 10b corresponding to areas of the front surface 10a over which the density of terminals 11 is comparatively high. As a result, the concavities 12 may be formed.

Even if the substrate 10 has the concavities 12 in the plural portions of the back surface 10b, the concavities 12 in the plural portions of the back surface 10b are filled in with a filler 13 and a flat plate 14 is placed over the back surface 10b, as illustrated in FIG. 7B. By doing so, an electronic part 2 is obtained. This is the same with the above case. Furthermore, as illustrated in FIG. 7C, the electronic part 2 (group of terminals 11 of the substrate 10) are bonded to a substrate 20 (group of terminals 21) to obtain an electronic device 1. This is the same with the above case.

Furthermore, in the above description a case where the group of terminals 11 each having a post 11a and the group of terminals 21 each having a post 21a are bonded together is taken as an example. However, a combination of a terminal 11 and a terminal 21 to be bonded together is not limited to this example.

Figure 8A:
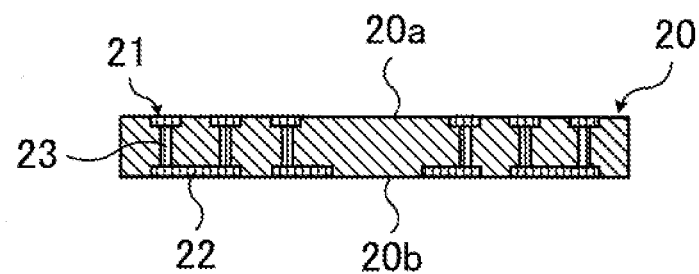
FIGS. 8A and 8B illustrate a second modification.
Figure 8B:
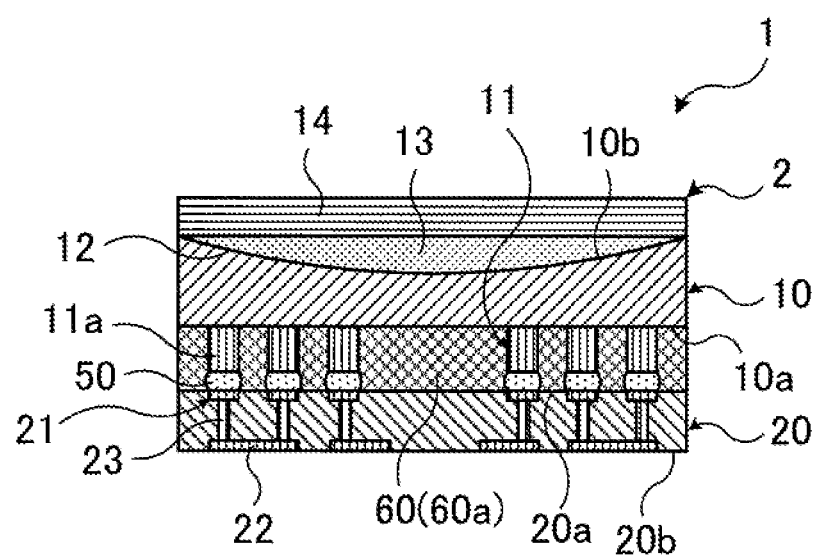

FIGS. 8A and 8B illustrate a second modification.

FIG. 8A is a fragmentary schematic sectional view of another example of the substrate 20. FIG. 8B is a fragmentary schematic sectional view of still another example of the electronic device 1.

A substrate 20 illustrated in FIG. 8A has pads as terminals 21 (does not have the above posts 21a). The substrate 20 illustrated in FIG. 8A is used. As illustrated in FIG. 8B, a group of posts 11a of terminals 11 of an electronic part 2 (substrate 10) are bonded to a group of terminals 21 of the substrate 20, which are pads, by solder bonding portions 50. The solder bonding portions 50 are formed by melting solders placed before bonding on the posts 11a at the time of bonding the substrate 10 and the substrate 20 together. Alternatively, the solder bonding portions 50 are formed by melting and integrating solders placed before bonding on the posts 11a and solders placed before bonding on the terminals 21 (pads) at the time of bonding the substrate 10 and the substrate 20 together. A Sn solder, a Sn—Ag solder, a Sn—Ag—Cu solder, a Sn—In solder, a Sn—Bi solder or the like is used as the solders on the posts 11a or the solders on the terminals 21.

As has been described, an electronic device 1 in which the group of terminals 11 each having a post 11a and the group of terminals 21, which are pads, are bonded together is also obtained. A filler 13 and a flat plate 14 is placed over a back surface 10b of the substrate 10 to minimize deformation of the substrate 10 at the time of the electronic part 2 being sucked and held. This minimizes variation in the distance between the group of terminals 11 of the substrate 10 and the group of pads of the substrate 20 and the occurrence of a bonding failure caused by this variation.

Furthermore, in the above description the substrate 10 having the posts 11a as the terminals 11 is taken as an example. However, there is no limit to the form of the terminals 11.

Figure 9A:
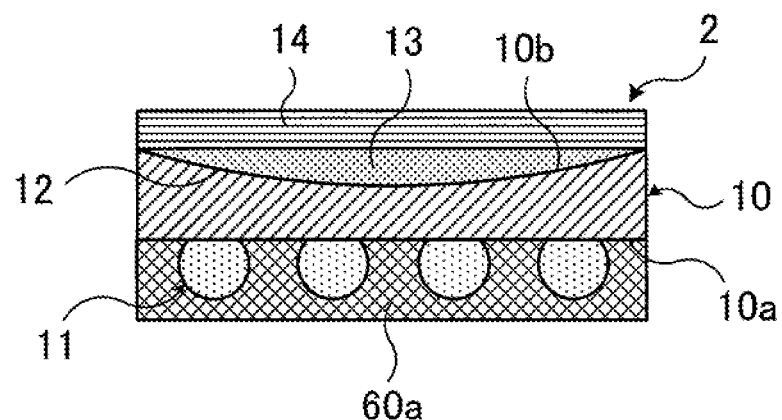
FIGS. 9A and 9B illustrate a third modification.
Figure 9B:
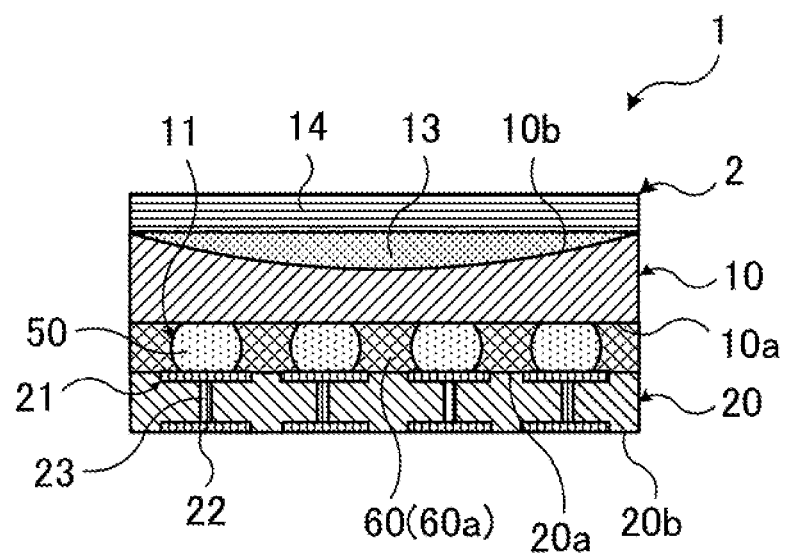

FIGS. 9A and 9B illustrate a third modification.

FIG. 9A is a fragmentary schematic sectional view of still another example of the electronic part 2. FIG. 9B is a fragmentary schematic sectional view of still another example of the electronic device 1.

A substrate 10 of an electronic part 2 illustrated in FIGS. 9A and 9B has solder ball bumps as terminals 11. The electronic part 2 including the substrate 10 illustrated in FIG. 9A is used. As illustrated in FIG. 9B, a group of solder ball bumps of the electronic part 2 (substrate 10), which are the terminals 11, are bonded to, for example, a group of pads of a substrate 20, which are terminals 21. Solder bonding portions 50 are formed by melting the solder ball bumps formed before bonding at the time of bonding the substrate 10 and the substrate 20 together. Alternatively, the solder bonding portions 50 are formed by melting and integrating the solder ball bumps formed before bonding and solders placed before bonding on the terminals 21 (pads) at the time of bonding the substrate 10 and the substrate 20 together. A Sn solder, a Sn—Ag solder, a Sn—Ag—Cu solder, a Sn—In solder, a Sn—Bi solder or the like is used as the solder ball bumps or the solders on the terminals 21.

As has been described, an electronic device 1 in which the group of terminals 11, which are solder ball bumps, are bonded to the group of terminals 21, which are pads, is also obtained. Even if the substrate 10 having solder ball bumps as the group of terminals 11 is used, a filler 13 and a flat plate 14 is placed over a back surface 10b of the substrate 10 to minimize deformation of the substrate 10 at the time of the electronic part 2 being sucked and held. This minimizes variation in the distance between the group of solder ball bumps of the substrate 10 and the group of pads of the substrate 20 and the occurrence of a bonding failure caused by this variation. In this example, the group of terminals 11, which are solder ball bumps, are bonded to the group of terminals 21, which are pads. However, the group of terminals 21 may be posts or solder ball bumps. In such a case, the same effect is also obtained.

Furthermore, in the above description a case where the concavity 12 in the back surface 10b of the substrate 10 is filled in with the filler 13, where the flat plate 14 is placed over the back surface 10b, and where the substrate 10 is bonded to the substrate 20 is taken as an example. However, the substrate 10 may be bonded to the following substrate. This substrate has a concavity in a surface. The concavity is filled in with a filler. A flat plate is placed over the surface. This is the same with the substrate 10.

Figure 10:
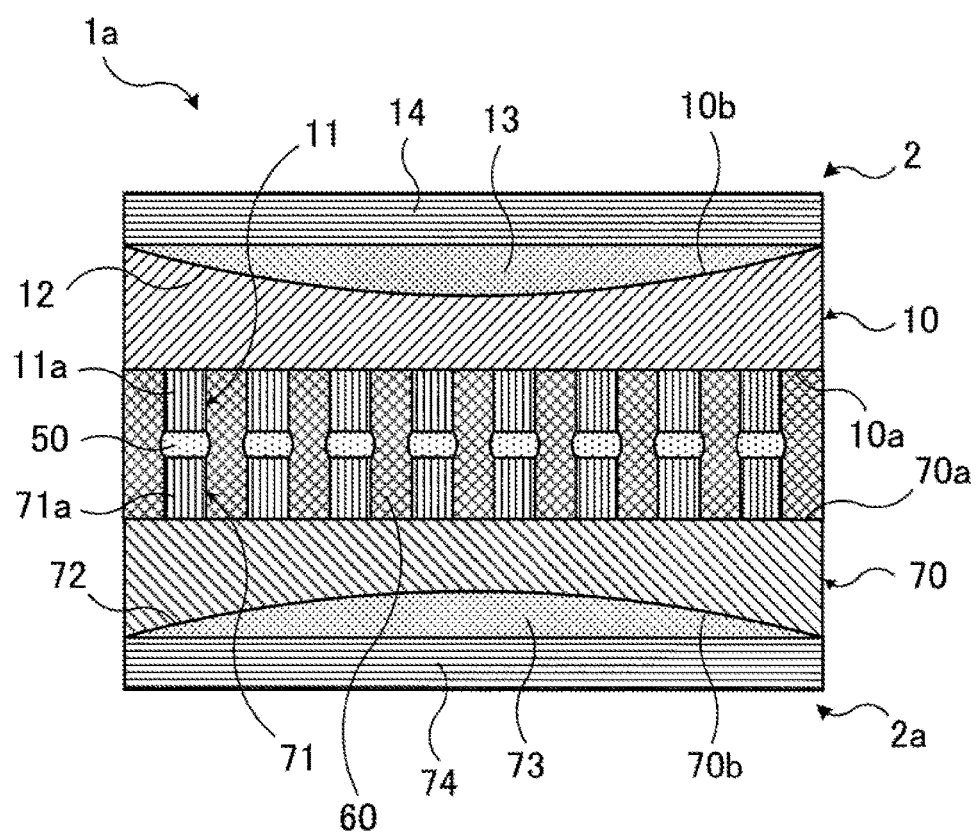
FIG. 10 illustrates a fourth modification.

FIG. 10 illustrates a fourth modification.

FIG. 10 is a fragmentary schematic sectional view of an electronic device 1a. The electronic device 1a illustrated in FIG. 10 includes an upper electronic part 2 including a substrate 10, a filler 13, and a flat plate 14 and a lower electronic part 2a including a substrate 70, a filler 73, and a flat plate 74.

The substrate 70 of the lower electronic part 2a has a group of terminals 71 over a surface (front surface) 70a and has a concavity 72 in a surface (back surface) 70b opposite to the front surface 70a. A terminal 71 including a post 71a formed so as to protrude from the front surface 70a of the substrate 70 is taken as an example. The post 71a is formed by the use of a material such as Cu, Ni, or Au. The post 71a is electrically connected to a conductor portion (not illustrated), such as an electrode, a wiring, or a via, or a circuit element (not illustrated), such as a transistor, formed in the substrate 70. Furthermore, the concavity 72 in which a central portion is deeper than an end portion in section is taken as an example. The concavity 72 is formed by, for example, the CMP or the back grind performed in the process of manufacturing the substrate 70.

The filler 73 is placed in the concavity 72 in the back surface 70b of the substrate 70. The same material that is used as the above filler 13 is used as the filler 73. The flat plate 74 is placed over the back surface 70b of the substrate 70 with the filler 73 in the concavity 72 therebetween. The same material that is used as the above flat plate 14 is used as the flat plate 74.

A structure including the substrate 70, the group of terminals 71, the concavity 72, the filler 73, and the flat plate 74 corresponds to the lower electronic part 2a of the electronic device 1a.

Terminals 11 (posts 11a) of the substrate 10 (electronic part 2) and the terminals 71 (posts 71a) of the substrate 70 are bonded together by solder bonding portions 50. The solder bonding portions 50 are formed by melting and integrating, for example, solders placed before bonding on the posts 11a of the substrate 10 and solders placed before bonding on the posts 71a of the substrate 70 at bonding time. A Sn solder, a Sn—Ag solder, a Sn—Ag—Cu solder, a Sn—In solder, a Sn—Bi solder or the like is used as the solders placed on the posts 11a of the substrate 10 or the solders placed on the posts 71a of the substrate 70. The substrate 10 and the substrate 70 are connected electrically and mechanically by the posts 11a, the solder bonding portions 50, and the posts 71a. In addition, bonding strength between the substrate 10 and the substrate 70 is improved by a resin layer 60 formed between the substrate 10 and the substrate 70 bonded together with the solder bonding portions 50 therebetween.

It is assumed that the substrate 70 has the concavity 72 in the back surface 70b, that the filler 73 is not placed in the concavity 72, and that the flat plate 74 is not placed over the back surface 70b. When the substrate 70 is sucked and held on a suction stage with the back surface 70b toward the suction stage in order to bond the substrate 70 to the electronic part 2, the concavity 72 is sucked on a sucking surface of the suction stage and deformation of the substrate 70 may occur. If such deformation of the substrate 70 occurs, height variation occurs in the group of terminals 71. As a result, variation in the distance between the group of terminals 11 of the substrate 10 and the group of terminals 71 occurs. Accordingly, a bonding failure may occur. For example, a bonding failure in which part of the terminals 11 (part of the group of terminals 11) are not bonded to part of the terminals 71 (part of the group of terminals 71) may occur.

As stated above, however, if the filler 73 is placed in the concavity 72 in the back surface 70b of the substrate 70 and the flat plate 74 is placed over the back surface 70b, deformation of the substrate 70 (electronic part 2a) is minimized even at the time of being sucked and held on the suction stage. As a result, when the group of terminals 11 and the group of terminals 71 are bonded together, a bonding failure does not occur. Accordingly, a high performance and high-quality electronic device 1a is realized.

With the electronic device 1a each of the concavity 12 and the concavity 72 may be formed in plural portions. This is the same with FIGS. 7A through 7C. Furthermore, each terminal 71 of the substrate 70 in the electronic device 1a is not limited to a terminal including a post 71a. Each terminal 71 of the substrate 70 in the electronic device 1a may be a pad as in the examples of FIGS. 8A and 8B. In addition, each terminal 11 of the substrate 10 in the electronic device 1a is not limited to a terminal including a post 11a. Each terminal 11 of the substrate 10 in the electronic device 1a may be a solder ball bump as in the examples of FIGS. 9A and 9B.

More concrete examples of an electronic device and an electronic device formation method will now be described as second through fifth embodiments.

First the second embodiment will be described.

An example of a case where semiconductor chips are used as the substrate 10 and the substrate 20 described in the above first embodiment will now be described as the second embodiment.

Figure 11A:
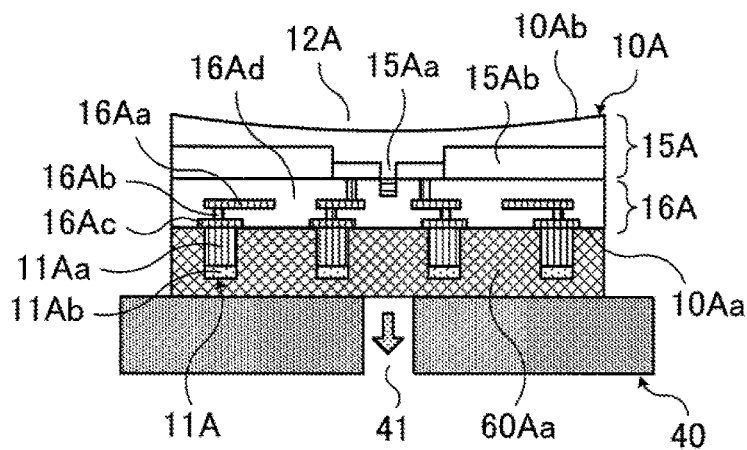
FIGS. 11A through 11C illustrate an example of an electronic part formation method according to a second embodiment.
Figure 11B:
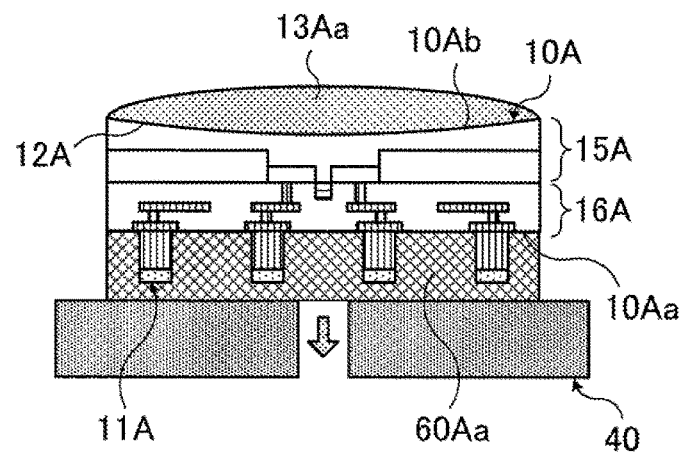
Figure 11C:
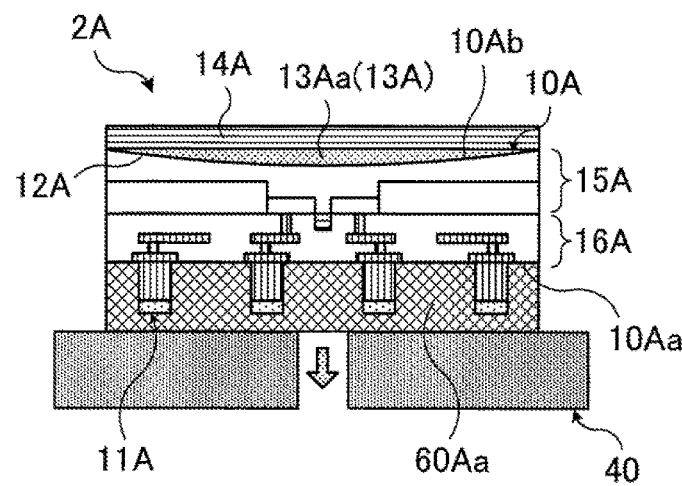

FIGS. 11A through 11C illustrate an example of an electronic part formation method according to the second embodiment.

FIG. 11A is a fragmentary schematic sectional view of a process for sucking a semiconductor chip 10A. FIG. 11B is a fragmentary schematic sectional view of a process for placing a filler 13A. FIG. 11C is a fragmentary schematic sectional view of a process for placing a flat plate 14A.

The semiconductor chip 10A illustrated in FIG. 11A includes a semiconductor substrate 15A and a wiring layer 16A formed over the semiconductor substrate 15A.

Circuit elements, such as transistors, resistors, and capacitors, are formed in a front surface of the semiconductor substrate 15A. In this example, a transistor 15Aa formed in an element region demarcated by an isolation region 15Ab is illustrated as a circuit element formed in the semiconductor substrate 15A.

The wiring layer 16A includes conductor portions, such as wirings 16Aa, vias 16Ab, and electrodes 16Ac, formed in an insulating portion 16Ad. The insulating portion 16Ad is formed by the use of an organic or inorganic insulating material. The conductor portions, such as the wirings 16Aa, the vias 16Ab, and the electrodes 16Ac, are formed by the use of a conductor material such as Cu or Al.

A group of terminals 11A are formed over the electrodes 16Ac in the wiring layer 16A. Each terminal 11A includes a post 11Aa protruding from a front surface 10Aa of the semiconductor chip 10A and a solder 11Ab placed at the tip of the post 11Aa. The post 11Aa is formed by the use of a material such as Cu, Ni, or Au. A solder, such as a Sn—Ag solder, containing Sn is used as the solder 11Ab. The circuit elements, such as the transistor 15Aa, formed in the semiconductor substrate 15A are electrically connected to the group of terminals 11A formed over the front surface 10Aa via the conductor portions, such as the wirings 16Aa, the vias 16Ab, and the electrodes 16Ac, in the wiring layer 16A.

As illustrated in FIG. 11A, there is a concavity 12A in a back surface 10Ab of the semiconductor chip 10A formed as a result of, for example, the CMP or the back grind performed on the semiconductor substrate 15A. A resin layer 60Aa is formed over the front surface 10Aa of the semiconductor chip 10A having the concavity 12A in the back surface 10Ab. The resin layer 60Aa side of the semiconductor chip 10A is sucked on a suction stage 40.

As illustrated in FIG. 11B, a filler 13Aa is then placed in the concavity 12A in the back surface 10Ab of the semiconductor chip 10A sucked on the suction stage 40. Furthermore, as illustrated in FIG. 11C, the flat plate 14A is placed over the back surface 10Ab and the filler 13Aa is cured (filler 13A is formed). The same material that is used as the above filler 13a and filler 13 may be used as the filler 13Aa and the filler 13A. The same material that is used as the above flat plate 14 may be used as the flat plate 14A.

An electronic part 2A including the semiconductor chip 10A, the filler 13A with which the concavity 12A in the back surface 10Ab of the semiconductor chip 10A is filled in, and the flat plate 14A placed over the back surface 10Ab with the filler 13A therebetween is formed by the processes illustrated in FIGS. 11A through 11C.

Figure 12A:
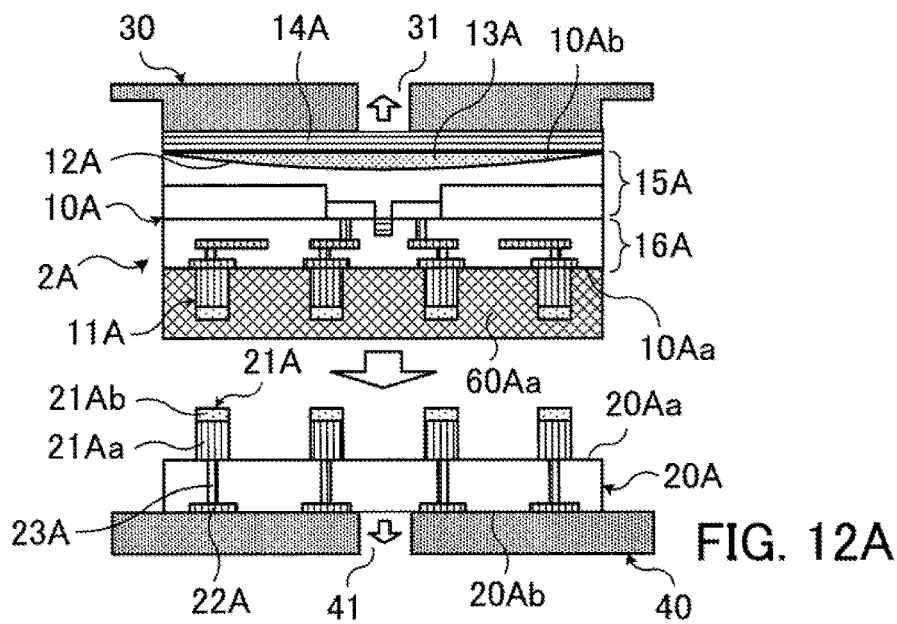
FIGS. 12A through 12C illustrate an example of a terminal group bonding method according to the second embodiment.
Figure 12B:
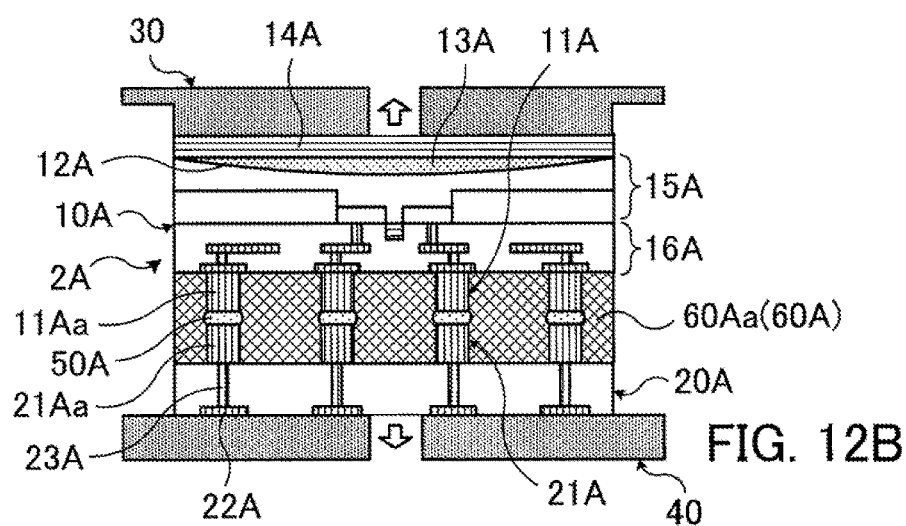
Figure 12C:
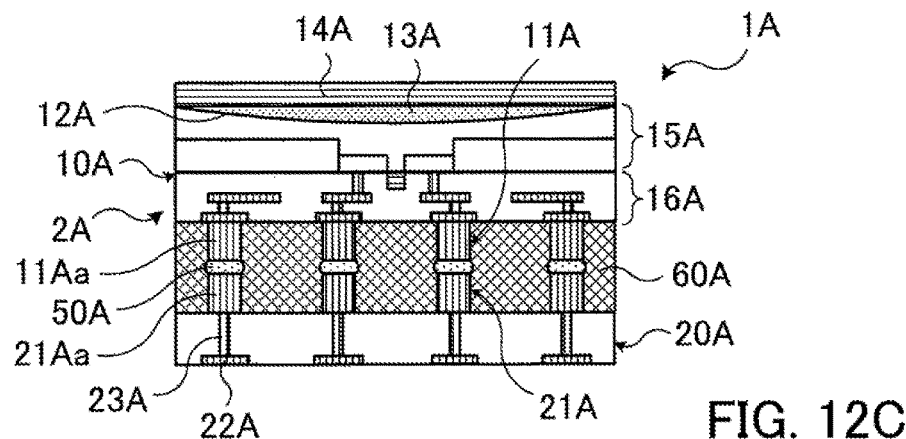

FIGS. 12A through 12C illustrate an example of a terminal group bonding method according to the second embodiment.

FIG. 12A illustrates an example of the state before bonding of the group of terminals 11A of the electronic part 2A (semiconductor chip 10A) and a group of terminals 21A of a semiconductor chip 20A. FIG. 12B illustrates an example of the state at bonding time of the group of terminals 11A of the electronic part 2A (semiconductor chip 10A) and the group of terminals 21A of the semiconductor chip 20A. FIG. 12C illustrates an example of the state after bonding of the group of terminals 11A of the electronic part 2A (semiconductor chip 10A) and the group of terminals 21A of the semiconductor chip 20A.

The electronic part 2A including the semiconductor chip 10A, the filler 13A, and the flat plate 14A is removed from the suction stage 40 and the group of terminals 11A of the electronic part 2A are bonded to the group of terminals 21A of the semiconductor chip 20A other than the semiconductor chip 10A.

As illustrated in FIG. 12A, the semiconductor chip 20A has the group of terminals 21A. Each terminal 21A includes a post 21Aa protruding from a front surface 20Aa of the semiconductor chip 20A and a solder 21Ab placed at the tip of the post 21Aa. The post 21Aa is formed by the use of a material such as Cu, Ni, or Au. A solder, such as a Sn—Ag solder, containing Sn is used as the solder 21Ab. The group of terminals 21A are formed at positions corresponding to the group of terminals 11A of the semiconductor chip 10A. The post 21Aa is electrically connected to a conductor portion (not illustrated), such as an electrode, a wiring, or a via, or a circuit element (not illustrated), such as a transistor, formed in the semiconductor chip 20A. Furthermore, the semiconductor chip 20A has a group of terminals 22A in a back surface 20Ab. In this example, pads are illustrated as the group of terminals 22A. A terminal 21A formed over the front surface 20Aa and a terminal 22A formed in the back surface 20Ab are electrically connected via a conductor 23A formed by the use of the TSV formation technique. The terminal 22A and the conductor 23A are formed by the use of a material such as Cu or Al.

As illustrated in FIG. 12A, the semiconductor chip 20A is held on a suction stage 40 which sucks the side of the back surface 20Ab in which the group of terminals 22A are formed. As illustrated in FIG. 12A, the electronic part 2A including the semiconductor chip 10A is held by a bonding tool 30 which sucks the flat plate 14A side and is disposed over the semiconductor chip 20A on the suction stage 40. Alignment between the group of terminals 11A and the group of terminals 21A is performed to dispose the group of terminals 11A opposite the group of terminals 21A.

As illustrated in FIG. 12B, at the same time that the electronic part 2A is being heated by, for example, the bonding tool 30, the electronic part 2A is pressed to the semiconductor chip 20A side. By doing so, the electronic part 2A is bonded to the semiconductor chip 20A. At that time a solder 11Ab of each terminal 11A which crashes through the resin layer 60Aa due to pressing touches a solder 21Ab of a corresponding terminal 21A on the semiconductor chip 20A side. The solder 11Ab and the solder 21Ab are melted and integrated by heating. By doing so, a solder bonding portion 50A is formed. As a result, the semiconductor chip 10A and the semiconductor chip 20A are connected electrically and mechanically by the posts 11Aa, the solder bonding portions 50A, and the posts 21Aa. Furthermore, a cured resin layer 60A is formed by heating at the time of the formation of the solder bonding portions 50A or by a curing process (heating, light irradiation, or the like) after the formation of the solder bonding portions 50A. Accordingly, bonding strength between the semiconductor chip 10A and the semiconductor chip 20A is improved.

As a result, an electronic device 1A illustrated in FIG. 12C is formed. The group of terminals 11A of the electronic part 2A including the semiconductor chip 10A and the group of terminals 21A of the semiconductor chip 20A are bonded together in the electronic device 1A.

With the electronic device 1A variation in the distance between the group of terminals 11A and the group of terminals 21A at bonding time is effectively minimized by the filler 13A and the flat plate 14A. As a result, the occurrence of a bonding failure caused by this variation is effectively reduced. Accordingly, a high performance and high-quality electronic device 1A is realized.

With the electronic device 1A the concavity 12A may be formed in plural portions of the back surface 10Ab of the semiconductor chip 10A. This is the same with FIGS. 7A through 7C. Furthermore, each terminal 21A of the semiconductor chip 20A in the electronic device 1A is not limited to a terminal including a post 21Aa. Each terminal 21A of the semiconductor chip 20A in the electronic device 1A may be a pad as in the examples of FIGS. 8A and 8B. In addition, each terminal 11A of the semiconductor chip 10A in the electronic device 1A is not limited to a terminal including a post 11Aa. Each terminal 11A of the semiconductor chip 10A in the electronic device 1A may be a solder ball bump as in the examples of FIGS. 9A and 9B. Moreover, the following chip may be used as the semiconductor chip 20A as in the example of FIG. 10. This semiconductor chip has a concavity in a surface opposite to a side on which the electronic part 2A is bonded. A determined filler is placed in the concavity and a determined flat plate is placed over the filler.

Next, the third embodiment will be described.

An example of a case where a semiconductor chip and a circuit board are used as the substrate 10 and the substrate 20, respectively, described in the above first embodiment will now be described as the third embodiment.

Figure 13A:
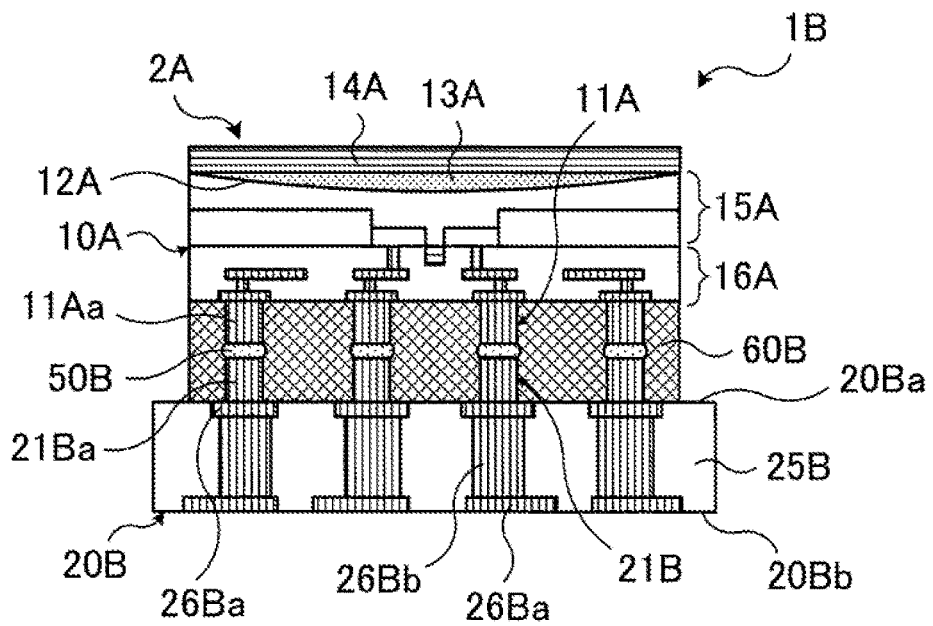
FIGS. 13A and 13B illustrate an example of an electronic device according to a third embodiment.
Figure 13B:
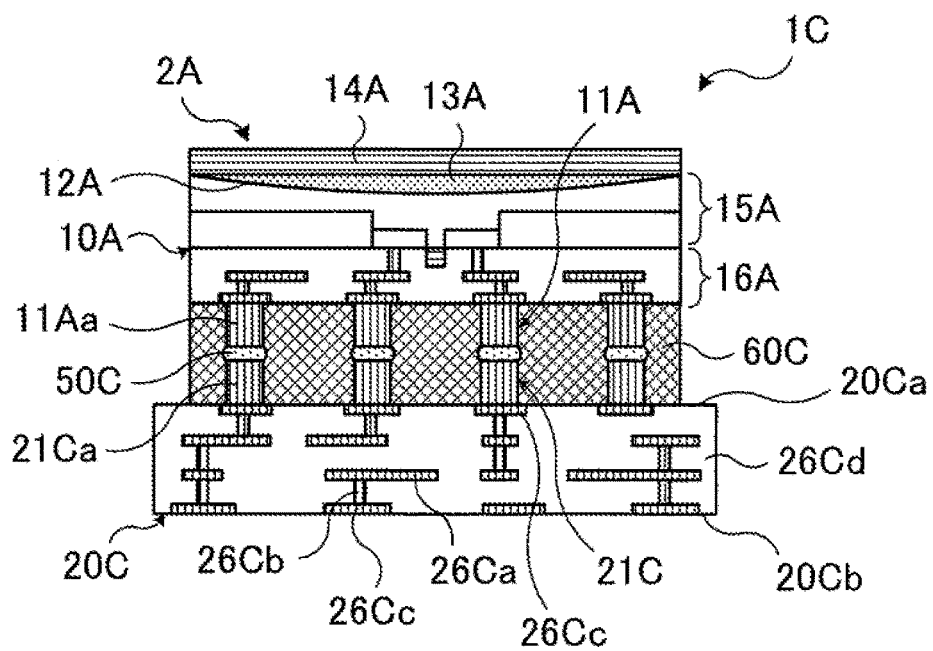

FIGS. 13A and 13B illustrate an example of an electronic device according to the third embodiment.

FIG. 13A is a fragmentary schematic sectional view of a first example of the structure of an electronic device 1B. The electronic device 1B illustrated in FIG. 13A includes an electronic part 2A including a semiconductor chip 10A, a filler 13A, and a flat plate 14A and formed by processes like those illustrated in FIGS. 11A through 11C and an interposer 20B.

The interposer 20B includes a substrate 25B and conductor portions such as wirings 26Ba and vias 26Bb. A material, such as Si or glass, is used as the substrate 25B. The conductor portions are formed by the use of a conductor material such as Cu. A group of terminals 21B are formed over parts (electrodes) of the wirings 26Ba in a front surface 20Ba of the interposer 20B. Each terminal 21B includes a post 21Ba protruding from a front surface 20Ba. The post 21Ba is formed by the use of a material such as Cu, Ni, or Au. Wirings 26Ba in the front surface 20Ba and a back surface 20Bb of the interposer 20B are electrically connected via a via 26Bb.

In the electronic device 1B, the group of terminals 21B of the interposer 20B and a group of terminals 11A of the electronic part 2A (semiconductor chip 10A) are bonded together by solder bonding portions 50B. The solder bonding portions 50B are formed by melting and integrating, for example, solders (solders containing Sn) placed before bonding on the posts 21Ba and solders (above solders 11Ab) placed before bonding on posts 11Aa at the time of bonding together the interposer 20B and the electronic part 2A. A resin layer 60B (obtained by curing the resin layer 60Aa illustrated in FIG. 12A, for example) is formed between the interposer 20B and the electronic part 2A in the electronic device 1B.

With the electronic device 1B in which the electronic part 2A is bonded in this way to a circuit board such as the interposer 20B, variation in the distance between the group of terminals 11A and the group of terminals 21B at bonding time is also minimized effectively by the filler 13A and the flat plate 14A. As a result, the occurrence of a bonding failure caused by this variation is effectively reduced. Accordingly, a high performance and high-quality electronic device 1B is realized.

With the electronic device 1B a concavity 12A may be formed in plural portions of a back surface 10Ab of the semiconductor chip 10A. This is the same with FIGS. 7A through 7C. Furthermore, each terminal 21B of the interposer 20B in the electronic device 1B is not limited to a terminal including a post 21Ba. Each terminal 21B of the interposer 20B in the electronic device 1B may be a wiring 26Ba (pad) in the front surface 20Ba as in the examples of FIGS. 8A and 8B. In addition, each terminal 11A of the semiconductor chip 10A in the electronic device 1B is not limited to a terminal including a post 11Aa. Each terminal 11A of the semiconductor chip 10A in the electronic device 1B may be a solder ball bump as in the examples of FIGS. 9A and 9B.

In addition, FIG. 13B is a fragmentary schematic sectional view of a second example of the structure of an electronic device 1C. The electronic device 1C illustrated in FIG. 13B includes an electronic part 2A including a semiconductor chip 10A, a filler 13A, and a flat plate 14A and formed by processes like those illustrated in FIGS. 11A through 11C and a printed circuit board 20C.

The printed circuit board 20C includes conductor portions, such as wirings 26Ca, vias 26Cb, and electrodes 26Cc, formed in an insulating portion 26Cd. In this example, the printed circuit board 20C having a multilayer wiring structure is illustrated. However, the number of layers formed by the wirings 26Ca is not limited to this example. The insulating portion 26Cd is formed by the use of an organic or inorganic insulating material. The conductor portions are formed by the use of a conductor material such as Cu or Al. A group of terminals 21C are formed over the electrodes 26Cc in a front surface 20Ca of the printed circuit board 20C. Each terminal 21C includes a post 21Ca protruding from the front surface 20Ca. The post 21Ca is formed by the use of a material such as Cu, Ni, or Au. Electrodes 26Cc in the front surface 20Ca and a back surface 20Cb of the printed circuit board 20C are electrically connected via a wiring 26Ca and a via 26Cb.

In the electronic device 1C, the group of terminals 21C of the printed circuit board 20C and a group of terminals 11A of the electronic part 2A (semiconductor chip 10A) are bonded together by solder bonding portions 50C. The solder bonding portions 50C are formed by melting and integrating, for example, solders (solders containing Sn) placed before bonding on the posts 21Ca and solders (above solders 11Ab) placed before bonding on posts 11Aa at the time of bonding together the printed circuit board 20C and the electronic part 2A. A resin layer 60C (obtained by curing the resin layer 60Aa illustrated in FIG. 12A, for example) is formed between the printed circuit board 20C and the electronic part 2A in the electronic device 1C.

With the electronic device 1C in which the electronic part 2A is bonded in this way to a circuit board such as the printed circuit board 20C, variation in the distance between the group of terminals 11A and the group of terminals 21C at bonding time is also minimized effectively by the filler 13A and the flat plate 14A. As a result, the occurrence of a bonding failure caused by this variation is effectively reduced. Accordingly, a high performance and high-quality electronic device 1C is realized.

With the electronic device 1C a concavity 12A may be formed in plural portions of a back surface 10Ab of the semiconductor chip 10A. This is the same with FIGS. 7A through 7C. Furthermore, each terminal 21C of the printed circuit board 20C in the electronic device 1C is not limited to a terminal including a post 21Ca. Each terminal 21C of the printed circuit board 20C in the electronic device 1C may be an electrode 26Cc (pad) in the front surface 20Ca as in the examples of FIGS. 8A and 8B. In addition, each terminal 11A of the semiconductor chip 10A in the electronic device 1C is not limited to a terminal including a post 11Aa. Each terminal 11A of the semiconductor chip 10A in the electronic device 1C may be a solder ball bump as in the examples of FIGS. 9A and 9B.

Next, the fourth embodiment will be described.

An example of a case where a semiconductor chip and a wafer are used as the substrate 10 and the substrate 20, respectively, described in the above first embodiment will now be described as the fourth embodiment.

Figure 14:
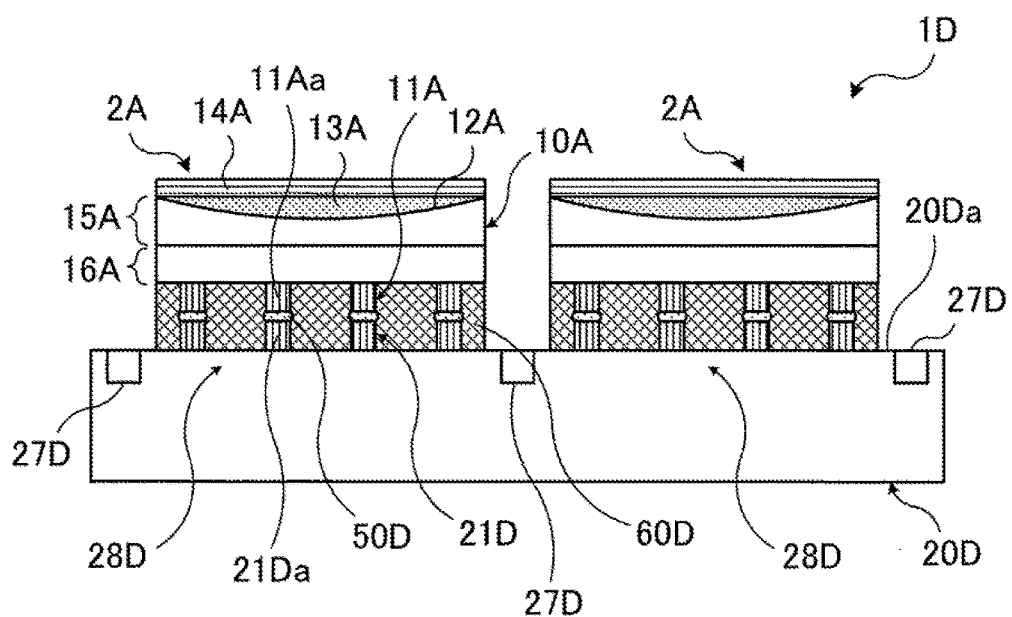
FIG. 14 illustrates an example of an electronic device according to a fourth embodiment.

FIG. 14 illustrates an example of an electronic device according to the fourth embodiment.

FIG. 14 is a fragmentary schematic sectional view of an electronic device 1D. The electronic device 1D illustrated in FIG. 14 includes a group of electronic parts 2A each including a semiconductor chip 10A, a filler 13A, and a flat plate 14A and formed by processes like those illustrated in FIGS. 11A through 11C and a wafer 20D over which the group of electronic parts 2A are mounted. In FIG. 14 (and FIG. 15), the details of the internal structure of the semiconductor chips 10A included in the electronic parts 2A are not illustrated.

The wafer 20D is a wafer before dicing for obtaining individual semiconductor chips. The wafer 20D has plural dicing lines (scribe lines) 27D and regions enclosed by the dicing lines 27D are regions (semiconductor chip formation regions) 28D in which semiconductor chips before dicing are to be formed. By dicing along the dicing lines 27D the wafer 20D in which determined structures corresponding to the semiconductor chips are formed, the individual semiconductor chips (semiconductor chip 20A illustrated in FIG. 12A, for example) each having the determined structure are obtained. A group of terminals 21D (group of terminals 21A illustrated in FIG. 12A, for example) are formed over a front surface 20Da of each semiconductor chip formation region 28D in the wafer 20D. Each terminal 21D includes a post 21Da protruding from the front surface 20Da. The post 21Da is formed by the use of a material such as Cu, Ni, or Au.

In the electronic device 1D, the groups of terminals 21D over the semiconductor chip formation regions 28D of the wafer 20D and groups of terminals 11A of the electronic parts 2A (semiconductor chips 10A) are bonded together by solder bonding portions 50D. The solder bonding portions 50D are formed by melting and integrating, for example, solders (solders containing Sn) placed before bonding on the posts 21Da and solders (above solders 11Ab) placed before bonding on posts 11Aa at the time of bonding together the wafer 20D and the electronic parts 2A. A resin layer 60D (obtained by curing the resin layer 60Aa illustrated in FIG. 12A, for example) is formed between the wafer 20D and the electronic parts 2A in the electronic device 1D.

With the electronic device 1D in which the electronic parts 2A are bonded in this way to the wafer 20D, variation in the distance between the groups of terminals 11A and the groups of terminals 21D at bonding time is also minimized effectively by the fillers 13A and the flat plates 14A. As a result, the occurrence of a bonding failure caused by this variation is effectively reduced. Accordingly, a high performance and high-quality electronic device 1D is realized.

Figure 15:
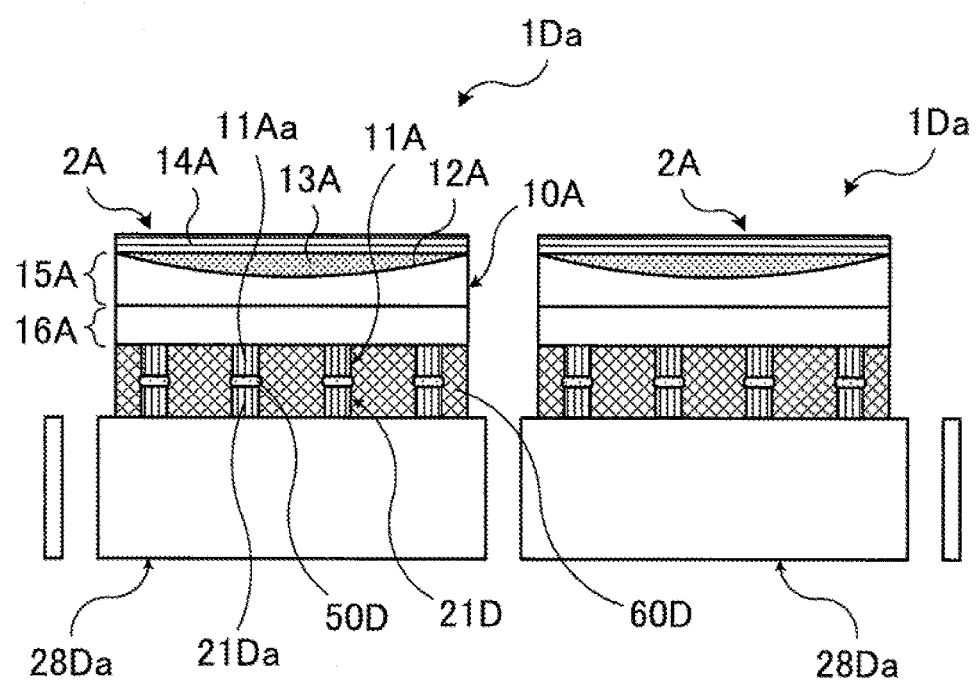
FIG. 15 illustrates another example of the electronic device according to the fourth embodiment.

FIG. 15 illustrates another example of the electronic device according to the fourth embodiment.

FIG. 15 is a fragmentary schematic sectional view of electronic devices 1Da obtained from the electronic device 1D illustrated in FIG. 14. The electronic device 1D illustrated in FIG. 14 is diced along the dicing lines 27D of the wafer 20D and the semiconductor chip formation regions 28D to which the electronic parts 2A are bonded are separated. As a result, as illustrated in FIG. 15, each electronic device 1Da (electronic device 1A illustrated in FIG. 12C, for example) in which an electronic part 2A is bonded to a semiconductor chip 28Da having the determined structure and formed in a semiconductor chip formation region 28D is obtained.

With the electronic device 1D or the electronic device 1Da a concavity 12A may be formed in plural portions of a back surface 10Ab of the semiconductor chip 10A. This is the same with FIGS. 7A through 7C. Furthermore, each terminal 21D of the wafer 20D or the semiconductor chip 28Da in the electronic device 1D or the electronic device 1Da is not limited to a terminal including a post 21Da. Each terminal 21D of the wafer 20D or the semiconductor chip 28Da in the electronic device 1D or the electronic device 1Da may be a pad as in the examples of FIGS. 8A and 8B. In addition, each terminal 11A of the semiconductor chip 10A in the electronic device 1D or the electronic device 1Da is not limited to a terminal including a post 11Aa. Each terminal 11A of the semiconductor chip 10A in the electronic device 1D or the electronic device 1Da may be a solder ball bump as in the examples of FIGS. 9A and 9B. Moreover, the following wafer may be used as a wafer to which the electronic parts 2A are bonded, as in the example of FIG. 10. This wafer has a concavity in a surface opposite to a side on which the electronic parts 2A are bonded. A determined filler is placed in the concavity and a determined flat plate is placed over the filler.

Next, the fifth embodiment will be described.

An example of a case where wafers are used as the substrate 10 and the substrate 20 described in the above first embodiment will now be described as the fifth embodiment.

Figure 16A:
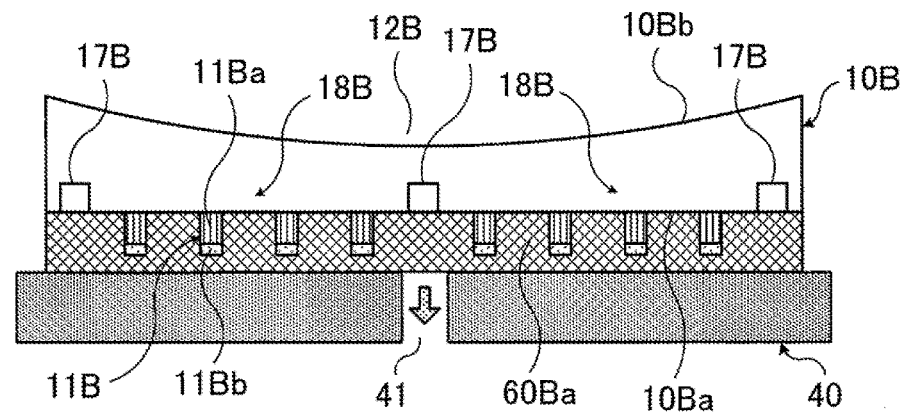
FIGS. 16A through 16C illustrate an example of an electronic part formation method according to a fifth embodiment.
Figure 16B:
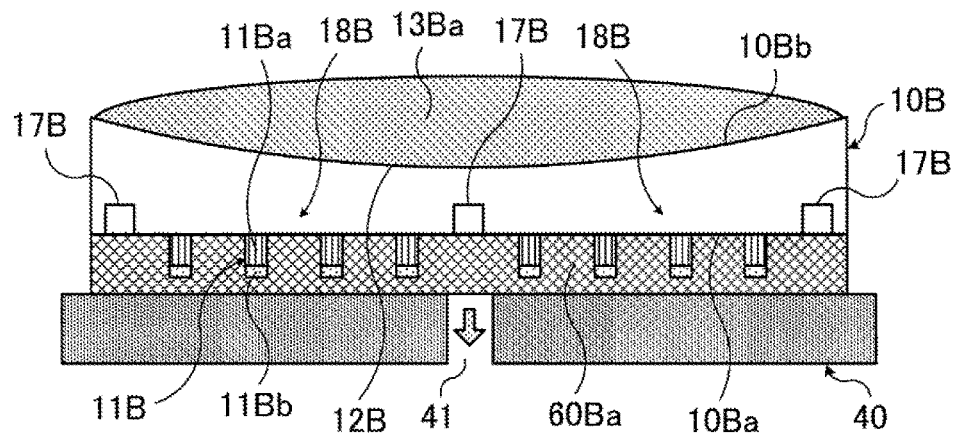
Figure 16C:
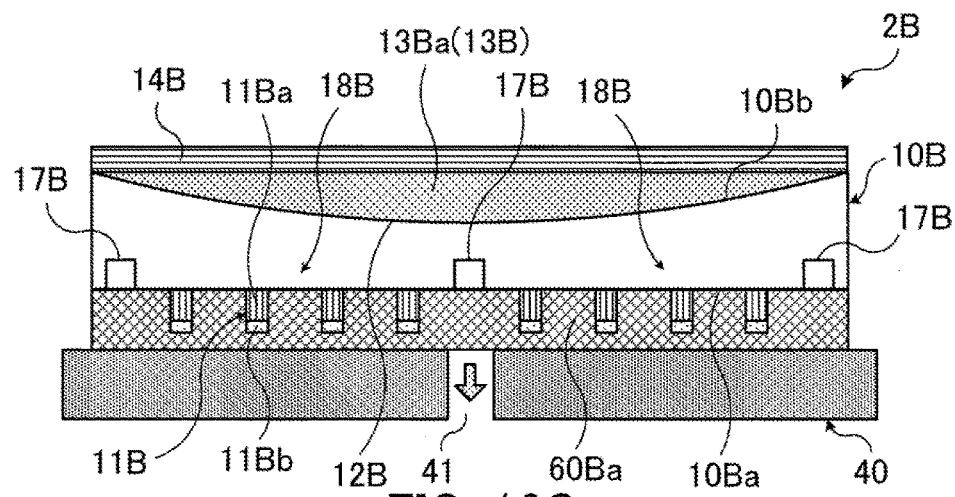

FIGS. 16A through 16C illustrate an example of an electronic part formation method according to the fifth embodiment.

FIG. 16A is a fragmentary schematic sectional view of a process for sucking a wafer 10B. FIG. 16B is a fragmentary schematic sectional view of a process for placing a filler 13B. FIG. 16C is a fragmentary schematic sectional view of a process for placing a flat plate 14B.

The wafer 10B illustrated in FIG. 16A is a wafer before dicing for obtaining individual semiconductor chips. Regions enclosed by dicing lines 17B are semiconductor chip formation regions 18B. By dicing the wafer 10B along the dicing lines 17B, the individual semiconductor chips (semiconductor chip 10A illustrated in FIG. 12A, for example) each having a determined structure are obtained. A group of terminals 11B (group of terminals 11A illustrated in FIG. 12A, for example) are formed over a front surface 10Ba of each semiconductor chip formation region 18B in the wafer 10B. Each terminal 11B includes a post 11Ba protruding from the front surface 10Ba and a solder 11Bb placed at the tip of the post 11Ba. The post 11Ba is formed by the use of a material such as Cu, Ni, or Au. A solder, such as a Sn—Ag solder, containing Sn is used as the solder 11Bb.

There is a concavity 12B in a back surface 10Bb of the wafer 10B formed by, for example, the CMP or the back grind performed in a manufacturing process. The shape or number of concavities 12B is not limited to that of the concavity 12B illustrated in FIG. 16A. As illustrated in FIG. 16A, a resin layer 60Ba is formed over the front surface 10Ba of the wafer 10B having the concavity 12B, and the resin layer 60Ba side is sucked on a suction stage 40.

As illustrated in FIG. 16B, a filler 13Ba is then placed in the concavity 12B in the back surface 10Bb of the wafer 10B sucked on the suction stage 40. Furthermore, as illustrated in FIG. 16C, a flat plate 14B is placed over the back surface 10Bb and the filler 13Ba is cured (filler 13B is formed). The same material that is used as the above filler 13a and filler 13 may be used as the filler 13Ba and the filler 13B. The same material that is used as the above flat plate 14 may be used as the flat plate 14B.

An electronic part 2B including the wafer 10B, the filler 13B with which the concavity 12B in the back surface 10Bb of the wafer 10B is filled in, and the flat plate 14B placed over the back surface 10Bb with the filler 13B therebetween is formed by the processes illustrated in FIGS. 16A through 16C.

Figure 17A:
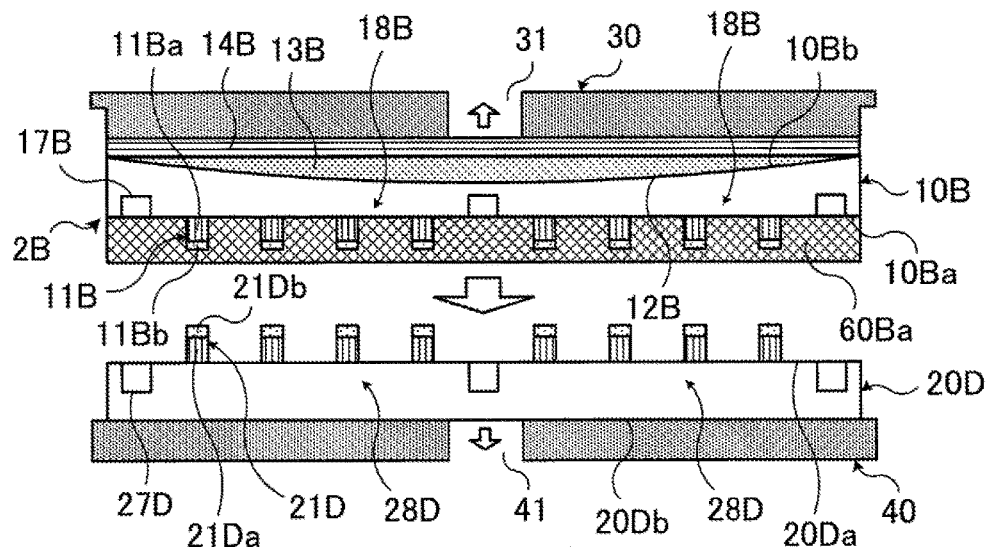
FIGS. 17A through 17C illustrate an example of a terminal group bonding method according to the fifth embodiment.
Figure 17B:
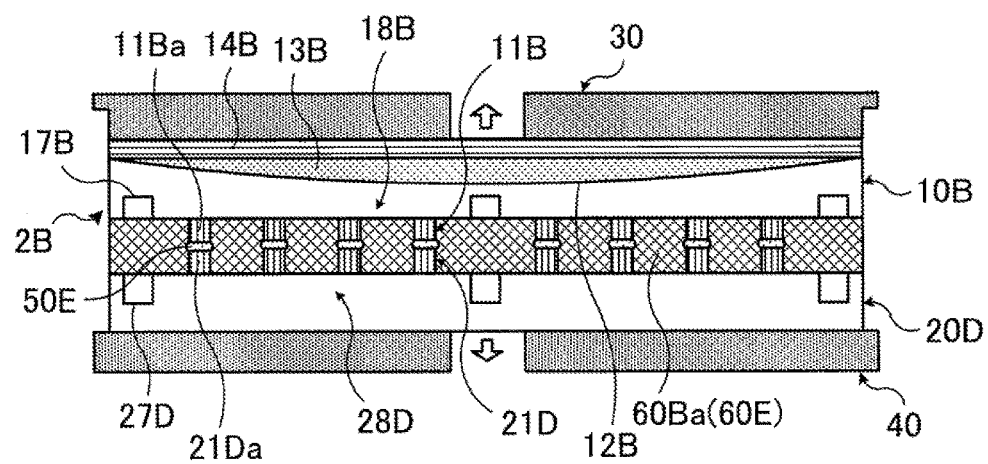
Figure 17C:
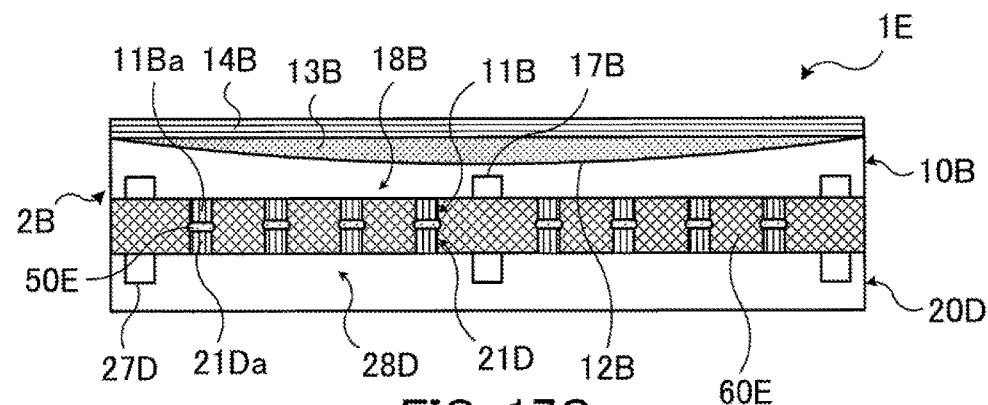

FIGS. 17A through 17C illustrate an example of a terminal group bonding method according to the fifth embodiment.

FIG. 17A illustrates an example of the state before bonding of the group of terminals 11B of the electronic part 2B (wafer 10B) and a group of terminals 21D of a wafer 20D. FIG. 17B illustrates an example of the state at bonding time of the group of terminals 11B of the electronic part 2B (wafer 10B) and the group of terminals 21D of the wafer 20D. FIG. 17C illustrates an example of the state after bonding of the group of terminals 11B of the electronic part 2B (wafer 10B) and the group of terminals 21D of the wafer 20D.

The electronic part 2B including the wafer 10B, the filler 13B, and the flat plate 14B is removed from the suction stage 40 and the group of terminals 11B of the electronic part 2B are bonded to the group of terminals 21D of the wafer 20D other than the wafer 10B.

As illustrated in FIG. 17A, the wafer 20D is held on a suction stage 40 which sucks the back surface 20Db side. As illustrated in FIG. 17A, the electronic part 2B including the wafer 10B is held by a bonding tool 30 which sucks the flat plate 14B side and is disposed over the wafer 20D on the suction stage 40. Alignment between the group of terminals 11B and the group of terminals 21D is performed to dispose the group of terminals 11B opposite the group of terminals 21D.

As illustrated in FIG. 17B, at the same time that the electronic part 2B is being heated by, for example, the bonding tool 30, the electronic part 2B is pressed to the wafer 20D side. By doing so, the electronic part 2B is bonded to the wafer 20D. At that time a solder 11Bb of each terminal 11B which crashes through the resin layer 60Ba due to pressing touches a solder 21Db of a corresponding terminal 21D on the wafer 20D side. The solder 11Bb and the solder 21Db are melted and integrated by heating. By doing so, a solder bonding portion 50E is formed. As a result, the electronic part 2B including the wafer 10B and the wafer 20D are connected electrically and mechanically by the posts 11Ba, the solder bonding portions 50E, and posts 21Da. Furthermore, a cured resin layer 60E is formed by heating at the time of the formation of the solder bonding portions 50E or by a curing process (heating, light irradiation, or the like) after the formation of the solder bonding portions 50E. Accordingly, bonding strength between the electronic part 2B including the wafer 10B and the wafer 20D is improved.

As a result, an electronic device 1E illustrated in FIG. 17C is formed. The group of terminals 11B of the electronic part 2B including the wafer 10B and the group of terminals 21D of the wafer 20D are bonded together in the electronic device 1E.

With the electronic device 1E in which the electronic part 2B including the wafer 10B is bonded in this way to the wafer 20D, variation in the distance between the group of terminals 11B and the group of terminals 21D at bonding time is also minimized effectively by the filler 13B and the flat plate 14B. As a result, the occurrence of a bonding failure caused by this variation is effectively reduced. Accordingly, a high performance and high-quality electronic device 1E is realized.

Figure 18:
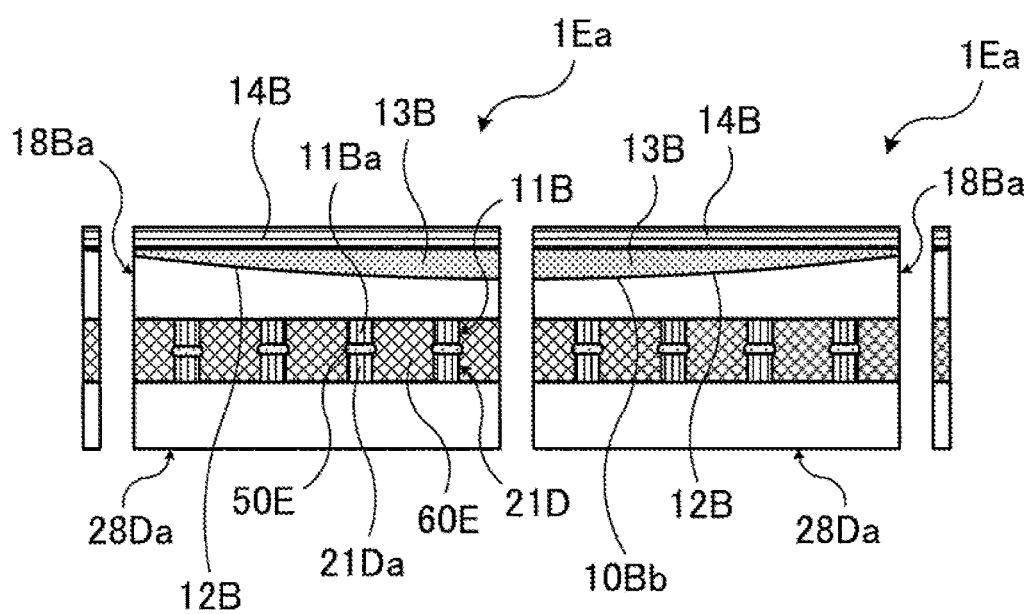
FIG. 18 illustrates another example of an electronic device according to the fifth embodiment.

FIG. 18 illustrates another example of the electronic device according to the fifth embodiment.

FIG. 18 is a fragmentary schematic sectional view of electronic devices 1Ea obtained from the electronic device 1E illustrated in FIG. 17C. With the electronic device 1E illustrated in FIG. 17C, for example, dicing lines 17B of the wafer 10B included in the electronic part 2B and dicing lines 27D of the wafer 20D are formed in advance in corresponding positions. The electronic device 1E is diced along the dicing lines 17B of the wafer 10B and the dicing lines 27D of the wafer 20D into individual semiconductor chip formation regions 18B and semiconductor chip formation regions 28D. As a result, as illustrated in FIG. 18, each electronic device 1Ea (electronic device 1A illustrated in FIG. 12C, for example) in which a semiconductor chip 18Ba formed in a semiconductor chip formation region 18B and a semiconductor chip 28Da formed in a semiconductor chip formation region 28D are bonded together is obtained.

With the electronic device 1E or the electronic device 1Ea a concavity 12B may be formed in plural portions of a back surface 10Bb of the wafer 10B or a semiconductor chip 18Ba. This is the same with FIGS. 7A through 7C. Furthermore, each terminal 21D of the wafer 20D or the semiconductor chip 28Da in the electronic device 1E or the electronic device 1Ea is not limited to a terminal including a post 21Da. Each terminal 21D of the wafer 20D or the semiconductor chip 28Da in the electronic device 1E or the electronic device 1Ea may be a pad as in the examples of FIGS. 8A and 8B. In addition, each terminal 11B of the wafer 10B in the electronic device 1E or the electronic device 1Ea is not limited to a terminal including a post 11Ba. Each terminal 11B of the wafer 10B in the electronic device 1E or the electronic device 1Ea may be a solder ball bump as in the examples of FIGS. 9A and 9B. Moreover, the following wafer may be used as a wafer to which the electronic part 2B is bonded, as in the example of FIG. 10. This wafer has a concavity in a surface opposite to a side on which the electronic part 2B is bonded. A determined filler is placed in the concavity and a determined flat plate is placed over the filler.

Furthermore, a case where dicing is performed after boding the wafer 10B and the wafer 20D together to obtain the electronic device 1Ea is taken as an example. However, the wafer 10B may be diced before boding the wafer 10B and the wafer 20D together.

Figure 19A:
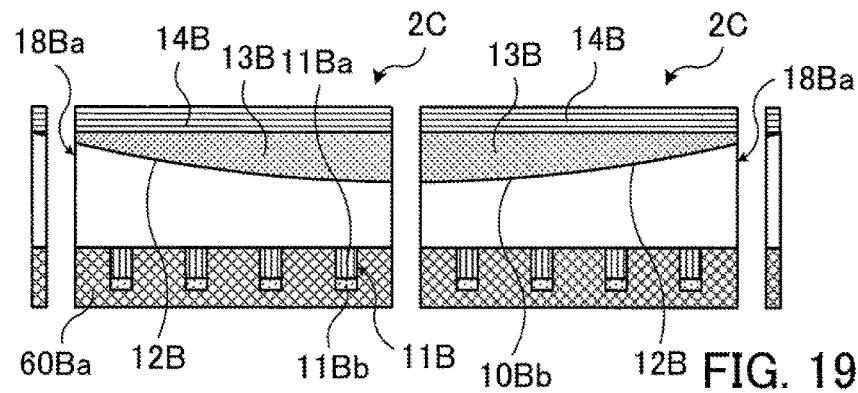
FIGS. 19A through 19C illustrate another example of the electronic part formation method according to the fifth embodiment and still another example of the electronic device according to the fifth embodiment.
Figure 19B:
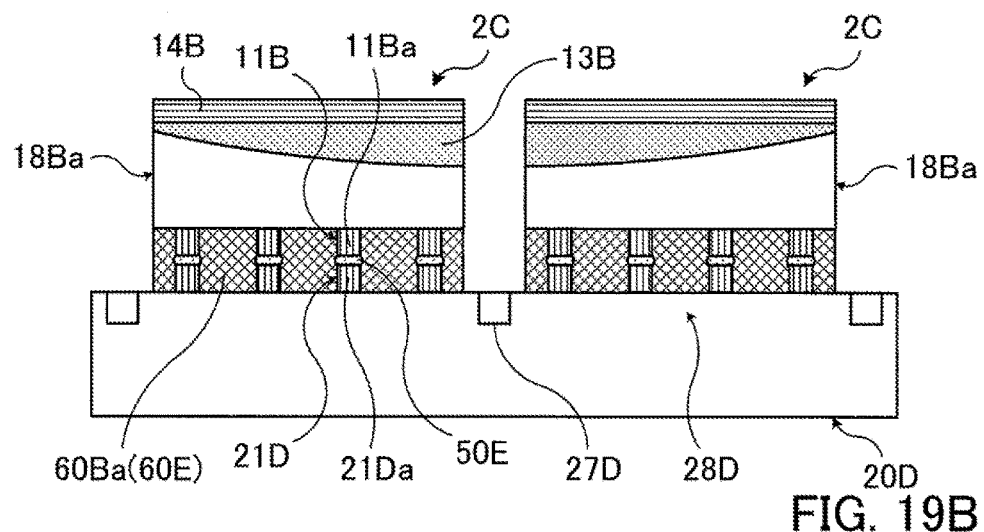
Figure 19C:
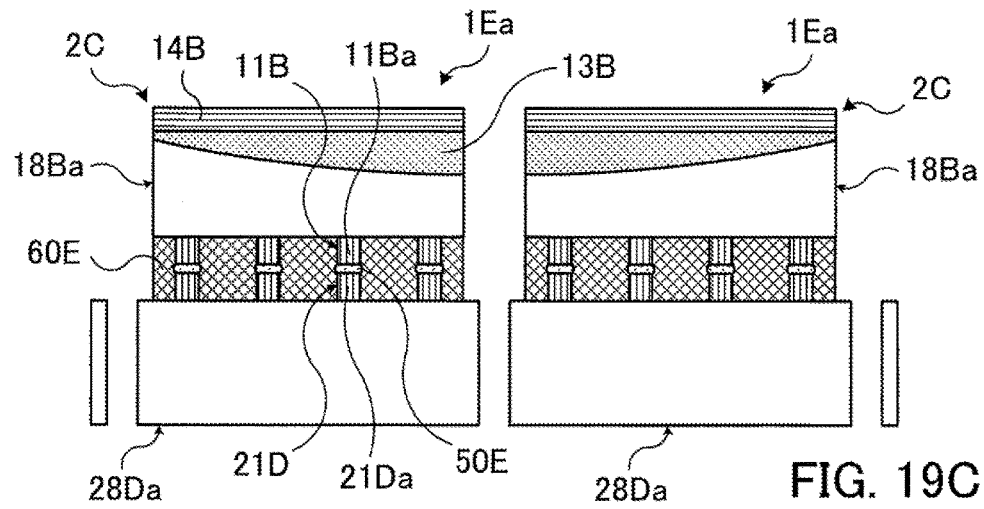

FIGS. 19A through 19C illustrate another example of the electronic part formation method according to the fifth embodiment and still another example of the electronic device according to the fifth embodiment.

FIG. 19A is a fragmentary schematic sectional view of a process for dicing a wafer 10B. FIG. 19B is a fragmentary schematic sectional view of a process for bonding individual electronic parts 2C. FIG. 19C is a fragmentary schematic sectional view of a process for dicing a wafer 20D.

In this example, as illustrated in FIGS. 16A through 16C, a filler 13B with which a concavity 12B in a back surface of the wafer 10B is filled in is placed and a flat plate 14B which covers the filler 13B is placed. After that, dicing is performed along dicing lines 17B. As a result, the individual electronic parts 2C illustrated in FIG. 19A are obtained. Each electronic part 2C includes a semiconductor chip 18Ba, the filler 13B with which the concavity 12B is filled in, and the flat plate 14B which covers the filler 13B.

As illustrated in FIG. 19B, a group of terminals 11B of each electronic part 2C obtained in this way are bonded to a group of terminals 21D of the wafer 20D by solder bonding portions 50E as in the example of FIG. 14 described in the above fourth embodiment. After that, as illustrated in FIG. 19C, the wafer 20D is diced along dicing lines 27D as in the example of FIG. 15. As a result, each electronic device 1Ea in which a semiconductor chip 18Ba and a semiconductor chip 28Da are bonded together is obtained. Each electronic device 1Ea is the same as each electronic device 1Ea illustrated in the example of FIG. 18.

The electronic device 1Ea is also obtained by the method illustrated in FIGS. 19A through 19C.

In addition, an example of an electronic device is illustrated in FIG. 20 with regard to the above first through fifth embodiments. FIG. 20 is a schematic perspective view of an example of an electronic device. As illustrated in FIG. 20, for example, the flat plate 14 described in the above first embodiment is equal or approximately equal in size to the back surface 10b of the substrate 10 in planar view. This minimizes an increase in the size (plane size) of the substrate 10 and the electronic part 2 caused by placing the filler 13 and the flat plate 14 for reducing a bonding failure.

If the semiconductor chip 10A is used as the substrate 10 (second to fourth embodiments), the flat plate 14A is equal or approximately equal in size to the back surface 10Ab of the semiconductor chip 10A in planar view. If the wafer 10B is used as the substrate 10 (fifth embodiment), the flat plate 14B is equal or approximately equal in size to the back surface 10Bb of the wafer 10B in planar view. In these cases, an increase in the size of the semiconductor chip 10A and the electronic part 2A or the wafer 10B and the electronic part 2B is also minimized.

The electronic devices 1, 1a, 1A, 1B, 1C, 1Da, 1Ea, and the like described in the above first through fifth embodiments are used in various electronic apparatuses, such as computers (personal computers, supercomputers, servers, and the like), smartphones, portable telephones, tablet terminals, sensors, cameras, audio devices, measuring devices, inspection devices, and manufacturing devices.

Figure 21:
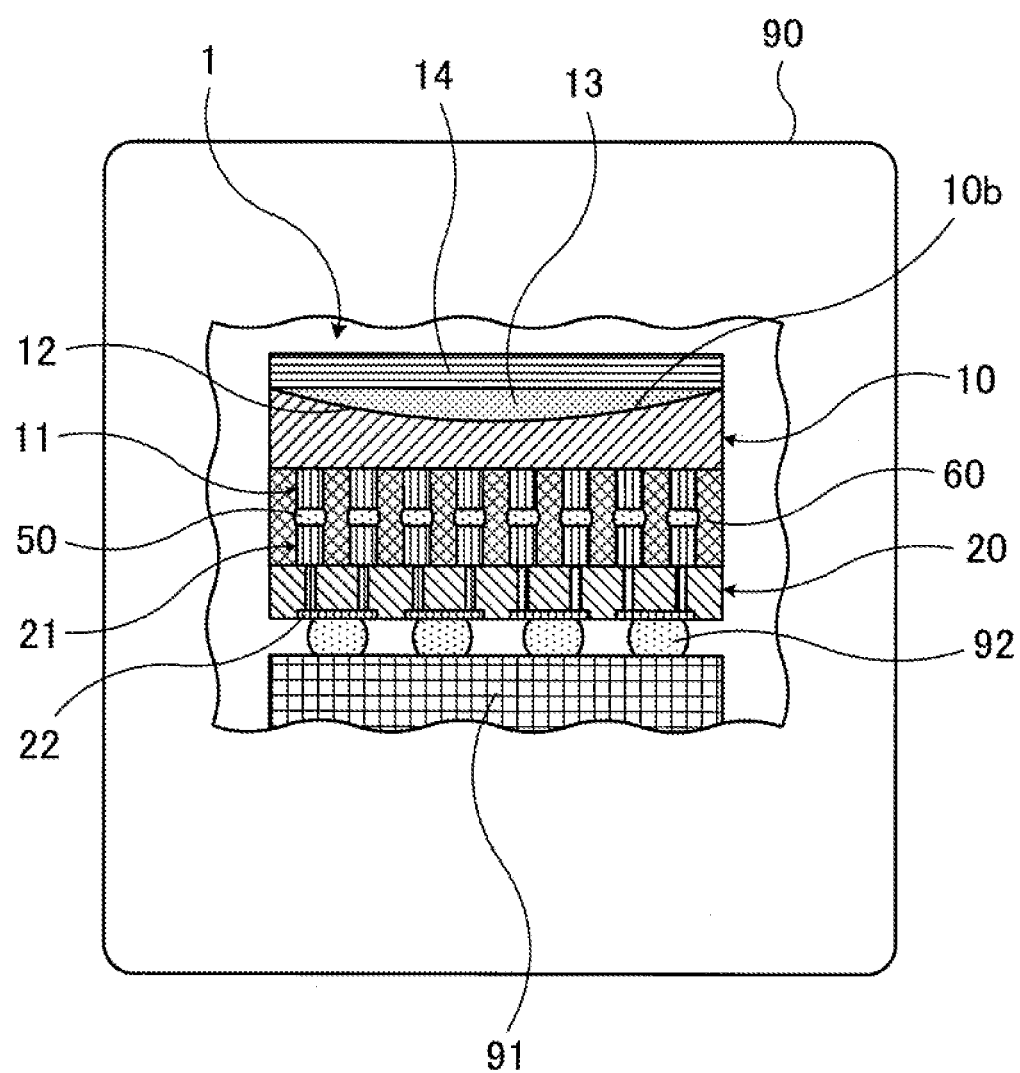
FIG. 21 illustrates an example of an electronic apparatus.

FIG. 21 illustrates an example of an electronic apparatus. FIG. 21 is a schematic view of an example of an electronic apparatus. As illustrated in FIG. 21, for example, the electronic device 1 illustrated in FIG. 4 is mounted (contained) in an aforementioned electronic apparatus 90 as an example. In this example, the electronic device 1 is connected electrically and mechanically to another electronic part 91 (semiconductor chip, a circuit board, or the like) via the terminals 22 and solder bonding portions 92.

With the electronic device 1, the concavity 12 in the back surface 10b of the substrate 10 is filled in with the filler 13 and the flat plate 14 is placed over the back surface 10b with the filler 13 therebetween. As a result, deformation of the substrate 10 sucked and held at the time of being bonded to the substrate 20 is minimized and a failure in bonding the group of terminals 11 and the group of terminals 21 together is reduced. Accordingly, a high performance and high-quality electronic device 1 is realized and a high performance and high-quality electronic apparatus 90 in which such an electronic device 1 is mounted is realized.

Electronic apparatuses in which the other electronic devices 1a, 1A, 1B, 1C, 1Da, 1Ea, and the like are mounted are also realized in the same way.

According to the disclosed techniques, a high performance and high-quality electronic device in which a failure in bonding together groups of terminals of substrates to be bonded together is reduced is realized. Furthermore, a high performance and high-quality electronic apparatus including such an electronic device is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic device fabrication method comprising:
   preparing an electronic part including:
   a first substrate having first terminals over a first surface and having a concavity in a second surface opposite to the first surface;
   a filler placed in the concavity; and
   a flat plate placed over the second surface with the filler therebetween; and
   making the first surface of the electronic part face a third surface of a second substrate having second terminals over the third surface and bonding the first terminals and the second terminals together,
   the preparing the electronic part includes:
   sucking and holding the first surface of the first substrate on a first sucking surface;
   placing the filler in the concavity of the first substrate sucked and held; and
   placing the flat plate over the second surface of the first substrate sucked and held with the filler therebetween.

2. The electronic device fabrication method according to claim 1, wherein the bonding the first terminals and the second terminals together includes sucking and holding the flat plate of the electronic part on a second sucking surface and making the first surface face the third surface.

3. The electronic device fabrication method according to claim 1, wherein the first substrate is a wafer including semiconductor elements.

4. The electronic device fabrication method according to claim 3 further comprising dicing the first substrate and the flat plate in positions in which the semiconductor elements of the first substrate are separated.

5. The electronic device fabrication method according to claim 3 further comprising, after the bonding the first terminals and the second terminals together, dicing the first substrate and the second substrate in positions in which the semiconductor elements of the first substrate are separated.

6. The electronic device fabrication method according to claim 1, wherein the first substrate is a semiconductor element.

7. The electronic device fabrication method according to claim 1, wherein the preparing the electronic part further includes forming over the first surface a resin layer which covers the first terminals.

* * * * *